US010861993B2

United States Patent
Ishikawa et al.

(10) Patent No.: US 10,861,993 B2
(45) Date of Patent: Dec. 8, 2020

(54) INSULATION PASTE, METHOD FOR PRODUCING INSULATION PASTE, METHOD FOR MANUFACTURING SOLAR CELL DEVICE, AND SOLAR CELL DEVICE

(71) Applicant: KYOCERA CORPORATION, Kyoto (JP)

(72) Inventors: Shinya Ishikawa, Higashiomi (JP); Motoki Shibahara, Hikone (JP); Satoshi Kitayama, Omihachiman (JP); Daisuke Ota, Otsu (JP); Takashi Koide, Osaka (JP); Tsuyoshi Kimura, Osaka (JP)

(73) Assignee: KYOCERA CORPORATION, Kyoto (JP)

( * ) Notice: Subject to any disclaimer, the term of this patent is extended or adjusted under 35 U.S.C. 154(b) by 168 days.

(21) Appl. No.: 16/007,907

(22) Filed: Jun. 13, 2018

(65) Prior Publication Data

US 2018/0294373 A1 Oct. 11, 2018

Related U.S. Application Data

(63) Continuation of application No. PCT/JP2016/088744, filed on Dec. 26, 2016.

(30) Foreign Application Priority Data

Dec. 25, 2015 (JP) ................. 2015-254634

(51) Int. Cl.
*H01L 31/048* (2014.01)
*H01B 3/46* (2006.01)
(Continued)

(52) U.S. Cl.
CPC .......... *H01L 31/0481* (2013.01); *H01B 3/46* (2013.01); *H01B 19/00* (2013.01);
(Continued)

(58) Field of Classification Search
None
See application file for complete search history.

(56) References Cited

U.S. PATENT DOCUMENTS 3,677,877 A * 7/1972 Narlock et al. ......... B29C 59/14
428/409
5,421,909 A 6/1995 Ishikawa et al.
(Continued)

FOREIGN PATENT DOCUMENTS

JP 7-263722 10/1995
JP 2002-363493 A 12/2002
(Continued)

OTHER PUBLICATIONS

DuPont Elvax EVA resins for Adhesives, Sealants and Wax Blends Data Sheet, 2012, 6 pages.
(Continued)

*Primary Examiner* — Magali P Slawski
(74) *Attorney, Agent, or Firm* — Duane Morris LLP

(57) ABSTRACT

An insulation paste for forming a protective layer of a solar cell device includes: a siloxane resin; an organic solvent; and multiple fillers each having a surface covered with an organic coating containing at least one material different from a material of the siloxane resin. A method for producing the insulation paste includes: preparing the multiple fillers; and mixing together a precursor of the siloxane resin, water, a catalyst, an organic solvent, and the multiple fillers. A method for manufacturing a solar cell device includes: applying the insulation paste to the passivation layer; and drying the insulation paste to form the protective layer on the passivation layer. A solar cell device includes: the passivation layer located on a semiconductor region; and the protective layer located on the passivation layer and including a siloxane resin and dimethylpolysiloxane.

5 Claims, 11 Drawing Sheets

(51) Int. Cl.
*H01L 31/068* (2012.01)
*H01L 31/0216* (2014.01)
*H01B 19/00* (2006.01)
*H01L 31/18* (2006.01)
*H01L 31/0236* (2006.01)

(52) U.S. Cl.
CPC .. *H01L 31/02167* (2013.01); *H01L 31/02168* (2013.01); *H01L 31/048* (2013.01); *H01L 31/068* (2013.01); *H01L 31/1868* (2013.01); *H01L 31/02366* (2013.01); *Y02E 10/546* (2013.01)

(56) References Cited

U.S. PATENT DOCUMENTS

| | | | |
|---|---|---|---|
| 6,703,132 B1* | 3/2004 | Yasuda | G01N 27/121 |
| | | | 428/447 |
| 8,557,718 B2 | 10/2013 | Vermang | |
| 2002/0084503 A1 | 7/2002 | Lee et al. | |
| 2004/0198855 A1 | 10/2004 | Adegawa | |
| 2006/0207646 A1 | 9/2006 | Terreau et al. | |
| 2007/0111014 A1 | 5/2007 | Katsoulis et al. | |
| 2009/0312487 A1 | 12/2009 | Kanamori et al. | |
| 2012/0048372 A1* | 3/2012 | Kim | H01L 31/02167 |
| | | | 136/258 |
| 2012/0073654 A1 | 3/2012 | Ketola et al. | |
| 2012/0097236 A1 | 4/2012 | Hu et al. | |
| 2012/0183776 A1 | 7/2012 | Arioka et al. | |
| 2012/0247559 A1 | 10/2012 | Nakamura et al. | |
| 2012/0306058 A1 | 12/2012 | Vermang | |
| 2012/0318349 A1 | 12/2012 | Shim et al. | |
| 2015/0090334 A1* | 4/2015 | Han | H01L 31/0201 |
| | | | 136/256 |
| 2015/0255638 A1 | 9/2015 | Karkkainen et al. | |
| 2015/0263187 A1 | 9/2015 | Chen | |
| 2016/0333258 A1* | 11/2016 | Drake | C09K 8/805 |
| 2017/0182247 A1* | 6/2017 | Fujita | A61B 5/1451 |
| 2019/0292667 A1* | 9/2019 | Fitz | C23F 11/10 |

FOREIGN PATENT DOCUMENTS

| | | |
|---|---|---|
| JP | 2006-083319 A | 3/2006 |
| JP | 2012-253356 A | 12/2012 |
| WO | 2008/007649 A1 | 1/2008 |
| WO | 2011/040255 A1 | 4/2011 |

OTHER PUBLICATIONS

Filipovic, L., Dissertation: "Topography Simulation of Novel Processing Techniques", Section 2.1 Silicon Dioxide Properties, 2012, 9 pages.

Sigma Aldrich, Poly(dimethylsiloxane-co-methylphenylsiloxane) Data Sheet, 2012, 2 pages.

Friedrich, K. et al., "Multifunctionality of Polymer Composites", Chapter 31.5, May 2015, William Andrew, pp. 931-936.

\* cited by examiner

IV-IV

FILLERS

FILLERS

F I G .  1 7
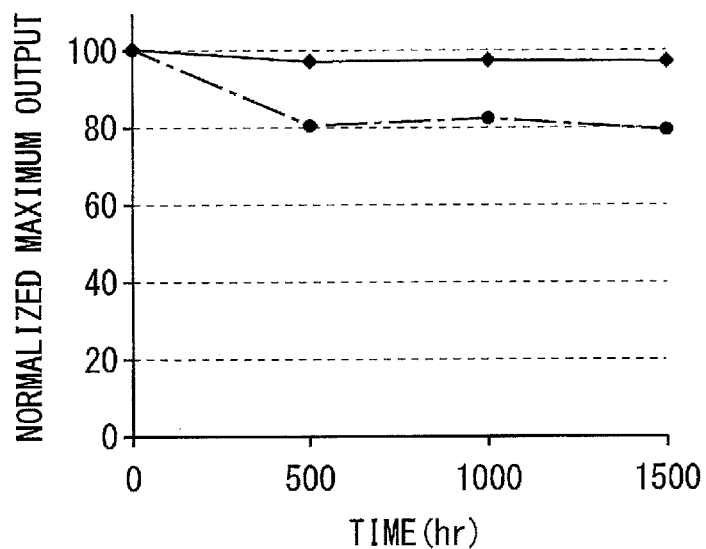
F I G .  1 8
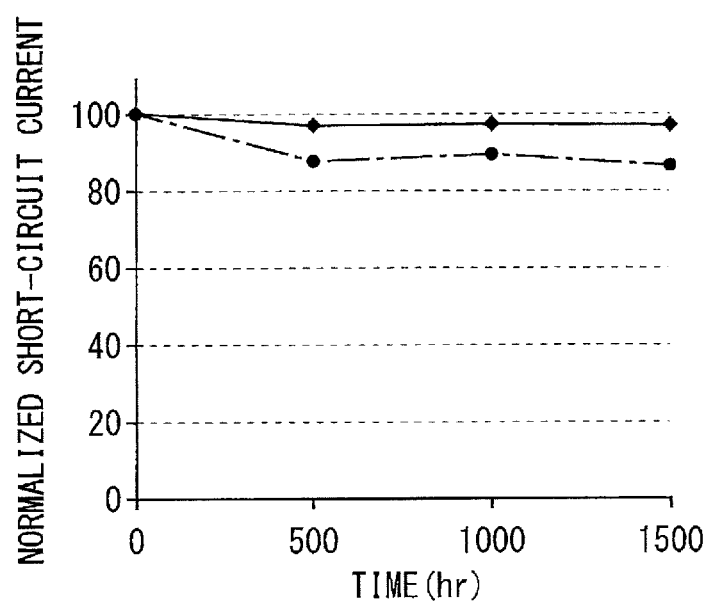

US 10,861,993 B2

INSULATION PASTE, METHOD FOR PRODUCING INSULATION PASTE, METHOD FOR MANUFACTURING SOLAR CELL DEVICE, AND SOLAR CELL DEVICE

CROSS-REFERENCE TO RELATED APPLICATIONS

The present application is a continuation based on PCT Application No. PCT/JP2016/088744, filed on Dec. 26, 2016, which claims the benefit of Japanese Application No. 2015-254634, filed on Dec. 25, 2015. PCT Application No. PCT/JP2016/088744 is entitled "INSULATION PASTE, METHOD FOR MANUFACTURING SAME, METHOD FOR MANUFACTURING SOLAR CELL ELEMENT, AND SOLAR CELL ELEMENT", and Japanese Application No. 2015-254634 is entitled "INSULATION PASTE, METHOD FOR MANUFACTURING SAME AND METHOD FOR MANUFACTURING SOLAR CELL ELEMENT". The contents of which are incorporated by reference herein in their entirety.

FIELD

The present disclosure relates to an insulation paste, a method for producing the insulation paste, a method for manufacturing a solar cell device, and the solar cell device.

BACKGROUND

Passivated emitter and rear cell (PERC) solar cell devices have been proposed. The PERC solar cell device includes, on the rear-surface side, a passivation layer located on the surface of the semiconductor substrate, and a dielectric layer located on the passivation layer to protect the passivation layer.

SUMMARY

An insulation paste, a method for producing the insulation paste, a method for manufacturing a solar cell device, and the solar cell device are disclosed. In one embodiment, the insulation paste is an insulation paste for forming a protective layer of a solar cell device. The insulation paste includes: a siloxane resin; an organic solvent; and multiple fillers each having a surface covered with an organic coating containing at least one material different from a material of the siloxane resin.

In one embodiment, the method for producing an insulation paste includes: preparing multiple fillers each having a surface covered with an organic coating containing at least one material different from a material of a siloxane resin; and mixing together a precursor of the siloxane resin, water, a catalyst, an organic solvent, and the multiple fillers.

In one embodiment, the method for manufacturing a solar cell device includes: forming a passivation layer on a semiconductor substrate; applying an insulation paste to the passivation layer; and drying the insulation paste to form a protective layer on the passivation layer. The insulation paste is for forming the protective layer of a solar cell device and includes a siloxane resin, an organic solvent, and multiple fillers each having a surface covered with an organic coating containing at least one material different from a material of the siloxane resin.

In one embodiment, the solar cell device includes: a semiconductor substrate having a p-type semiconductor region at a surface of the semiconductor substrate; a passivation layer located on the p-type semiconductor region; and a protective layer located on the passivation layer. The passivation layer includes an aluminum oxide. The protective layer contains a silicon oxide. The protective layer includes a siloxane resin and dimethylpolysiloxane.

BRIEF DESCRIPTION OF THE DRAWINGS

FIG. 17 illustrates a graph showing an example test result on the reliability of solar cell modules according to working examples and reference examples.

FIG. 18 illustrates a graph showing an example test result on the reliability of the solar cell modules according to working examples and reference examples.

DETAILED DESCRIPTION

Figure 1:
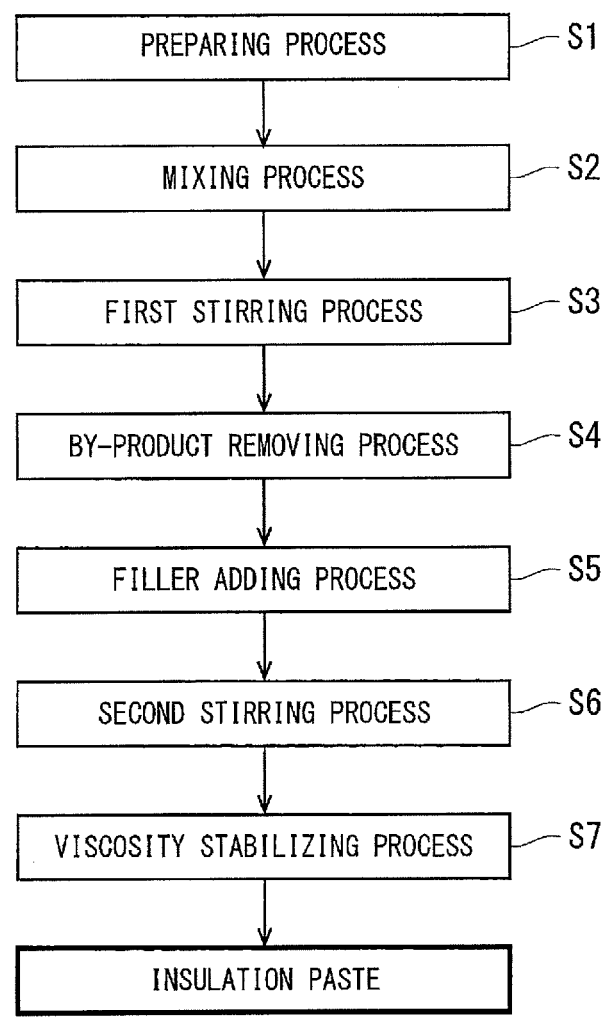
FIG. 1 illustrates a flowchart showing an example method for producing an insulation paste according to one embodiment.

There is scope for improvement in improving the quality of passivation layers in solar cell devices. For example, a solar cell device including a layer disposed on a passivation layer to protect the passivation layer (also referred to as a protective layer) is known. The protective layer can be formed on the passivation layer by plasma-enhanced chemical vapor deposition (PECVD).

During formation of the protective layer on the passivation layer by PECVD, however, for example, plasmatized material gas may lower the quality of the passivation layer. Deterioration in the protective layer over time may also lower its performance of protecting the passivation layer, leading to deterioration in the quality of the passivation layer over time.

The inventors of the present application have developed technology to improve the quality of the passivation layer of the solar cell device. Various embodiments on the technology will be described below with reference to the drawings. The same reference signs are allocated to components having similar structures and functions in the drawings, and description thereof will not be repeated below. The drawings are schematically shown. Some electrodes are omitted in FIG. 4.

<Insulation Paste>

Insulation pastes can be used as, for example, materials for forming a protective layer that protects a passivation layer of a solar cell device. The insulation paste according to one embodiment includes, for example, a siloxane resin, an organic solvent, and multiple fillers each with a surface covered with an organic coating containing a material different from that of the siloxane resin.

The siloxane resin is a siloxane compound having a Si—O—Si bond (also referred to as a siloxane bond). The siloxane resin is, for example, a low-molecular weight resin obtained by hydrolysis and condensation polymerization of alkoxysilane, silazane, or the like. In addition to the siloxane bond, the siloxane resin may have at least one of the following bonds: a Si—R bond, a Si—OR bond, and a Si—OH bond, for example. "R" in the bond denotes an alkyl group such as a methyl group or an ethyl group. The siloxane resin herein has a high reactivity when it has at least one of the Si—OR bond and the Si—OH bond. Here, the protective layer formed of the insulation paste is expected to be strongly bound to other portions of the solar cell device being in contact with the protective layer. If the siloxane resin has the Si—OH bond, for example, the siloxane resin easily binds to silicon, aluminum, and the like as hydrogen atoms are disconnected from an OH group. Alternatively, the siloxane resin easily binds to silicon, aluminum, and the like as the OH group on the surface of silicon, aluminum, and the like reacts with the Si—OH bond of the siloxane resin to emit a water molecule. If the siloxane resin has the Si—OR bond and, for example, water, a catalyst, and the like used or generated in a process of producing the insulation paste to be described later remain in the protective layer, the Si—OR bond is easily hydrolyzed by the water, the catalyst, and the like to generate the OH group. The siloxane resin thus easily binds to silicon, aluminum, and the like similarly as when the siloxane resin has the above-mentioned Si—OH bond. As described above, increase in bonding strength of the siloxane resin improves adhesion between the protective layer formed of the insulation paste and the other portions adjacent to the protective layer (also referred to as adjacent portions). Conceivable examples of the other portions adjacent to the protective layer include a substrate (e.g., a silicon substrate) as a foundation on which the protective layer is formed, another foundation such as an insulating layer, and a metal layer formed on the protective layer. Adhesion between the protective layer and the adjacent portions will be improved when the siloxane resin includes three or four Si—O bonds per Si atom. A material having three or four Si—OR bonds per Si atom is thus used as, for example, a precursor of the siloxane resin in producing the insulation paste. As a result, at least one of the number of Si—OR bonds and the number of Si—OH bonds increases in the siloxane resin obtained by hydrolyzing and condensation polymerizing the precursor of the siloxane resin to thereby achieve high bonding strength between the protective layer and the adjacent portions. In other words, high adhesion between the protective layer and the adjacent portions is achieved. The siloxane resin may have a Si—H bond, a Si—N bond, and the like not having undergone hydrolysis if the siloxane resin is a resin obtained by condensation polymerizing a functional compound having the Si—H bond and the Si—N bond having hydrolyzability.

If the insulation paste (100% by mass) includes, for example, 7% by mass to 92% by mass of the siloxane resin, a dense protective layer is formed by applying the insulation paste to a foundation and drying the insulation paste. This can increase the barrier function of the protective layer. The insulation paste is hardly gelatinized if the insulation paste (100% by mass) includes 7% by mass to 92% by mass of the siloxane resin. This prevents an excessive increase in viscosity of the insulation paste. When the insulation paste (100% by mass) includes 40% by mass to 90% by mass of the siloxane resin, for example, it is easy to form a dense protective layer and to prevent gelation of the insulation paste.

The insulation paste may further include, for example, a hydrolysable additive having the Si—O bond or the Si—N bond, and not having undergone condensation polymerization. Such an additive is, for example, expressed by the following general formula 1:

$$(R1)_{4-a-b}Si(OH)_a(OR2)_b \qquad \text{general formula 1.}$$

R1 and R2 in the general formula 1 denote, for example, alkyl groups such as a methyl group ($CH_3$) and an ethyl group ($CH_2CH_3$). Furthermore, a and b are expressed by any integers from 0 to 4, and a+b is expressed by any integer from 1 to 4. R1 and R2 may denote the same alkyl group or different alkyl groups. If the insulation paste contains a hydrolytic additive having the Si—O bond or the Si—N bond and not having undergone condensation polymerization, a ratio of the Si—OR bond or the Si—OH bond in the siloxane resin increases more than that of the insulation paste with no additive. This is because the siloxane resin hardly undergoes hydrolysis of the Si—OR bond and condensation polymerization in which the Si—OH bond changes into the siloxane bond and water. Increase in the ratio of the Si—OR bond or the Si—OH bond in the siloxane resin leads to higher adhesion between the protective layer and the adjacent portions of the holding layer. The insulation paste shows a tendency to gradually thicken through condensation polymerization and be gelatinized even during storage. The insulation paste according to one embodiment, however, contains the above-mentioned additive, and thus can develop a condensation polymerization reaction between the hydrolyzed additive and the siloxane resin having undergone condensation polymerization and having a high molecular weight. This inhibits the condensation polymerization reaction between siloxane resins having high molecular weights, so that the insulation paste is hardly gelatinized, and does not extremely increase in viscosity.

The fillers each have a surface covered with an organic coating containing a material different from that of the siloxane resin. This can reduce the number of dangling bonds on the surfaces of the fillers. Here, the fillers hardly repel one another as the surfaces of the fillers are hardly electrically charged, for example. In addition, the siloxane resin and the fillers hardly bind to each other herein. The fillers can thus be appropriately aggregated with one another with some distance therebetween. As a result, the fillers are hardly evenly dispersed, so that the insulation paste can appropriately thicken. Furthermore, the OH group is hardly formed on the surfaces of the fillers, so that reaction of the OH group on the surfaces of the fillers with the OH group of the siloxane resin is reduced, and the fillers and a component of the siloxane resin hardly bind to each other. The insulation paste is thus hardly gelatinized, and does not extremely increase in viscosity. Spreadability and viscosity stability of the insulation paste can thereby be improved, for example. The protective layer formed of the insulation paste can thus improve the function of protecting the passivation layer. The insulation paste even stored for a long time period or continuously used can stably be applied in a desired pattern. As a result, deterioration in the quality of the passivation layer of the solar cell device over time can be reduced, leading to improvement in the quality of the passivation layer.

When the material contained in the organic coating covering the surfaces of the fillers has a structure in which the number of carbon atoms in a main chain or the total number of carbon atoms and silicon atoms in the main chain is six or more, the component of the organic coating improves hydrophobicity of the protective layer. Specific examples of the material of the organic coating covering the surfaces of the fillers include the alkyl group in which the number of carbon atoms in the main chain is six or more and octylsilane and the like in which the total number of carbon atoms and silicon atoms in the main chain is six or more. The polarity hardly occurs, for example, in the alkyl group in which the number of carbon atoms in the main chain is six or more and in octylsilane and the like even upon reaction with the OH group, thus easily maintaining hydrophobicity of the protective layer. Furthermore, dimethylpolysiloxane in which the total number of carbon atoms and silicon atoms in the main chain is six or more may be adopted as the specific material of the organic coating covering the surfaces of the fillers. Dimethylpolysiloxane has a spiral main chain and has a methyl group on the surface thereof to have hydrophobicity, for example. Thus, a protective layer having hydrophobicity has film quality hardly changed by moisture and the like, and maintains its insulating characteristics. The protective layer formed of the insulation paste can thus improve the function of protecting the passivation layer. As a result, deterioration in the passivation layer of the solar cell device over time can be reduced, leading to improvement in the quality of the passivation layer. When the total number of carbon atoms and silicon atoms in the main chain of the organic coating covering the surfaces of the fillers is 10,000 or less, for example, grain diameters of aggregated fillers do not extremely increase, thereby hardly resulting in inhomogeneous thickness of a coating film in applying a conductive paste. In other words, spreadability of the conductive paste will be improved. With this, the protective layer formed of the insulation paste can thus improve the function of protecting the passivation layer.

More specifically, at least one type of materials including, for example, octylsilane expressed by a chemical formula 1, a dodecyl group expressed by a chemical formula 2, and dimethylpolysiloxane expressed by a general formula 2 that are indicated below is used as the material of the organic coating covering the surfaces of the fillers.

$$C_8H_{20}Si \quad \text{(chemical formula 1)}$$

$$-C_{12}H_{25} \quad \text{(chemical formula 2)}$$

$$-(O-Si(R3)_2)_x-Si(R3)_3 \quad \text{(general formula 2)}$$

R3 in the general formula 2 denotes the methyl group ($CH_3$), for example. R3 may partially be hydrogen (H), for example. Furthermore, x is expressed by an integer greater than or equal to 6.

Dimethylpolysiloxane is a polymeric compound having the Si—O—Si bond (siloxane bond).

The fillers may include a plurality of fillers having surfaces covered with different types of organic coatings, for example. Here, the stickiness of a plate for platemaking to a substrate, which is presumably caused by reduction of surface tension, can be reduced in applying the insulation paste to the substrate, for example. Here, the insulation paste can be easily applied in any pattern during printing, thereby improving printability of the insulation paste. Here, fillers having surfaces covered with the organic coating containing, as a material, dimethylpolysiloxane expressed by the general formula 2 and fillers having surfaces covered with the organic coating containing, as a material, octylsilane expressed by the chemical formula 1 can be used, for example.

The gross mass of the fillers is set so that concentration of the fillers in the insulation paste has a value of 3% by mass to 30% by mass, for example. Here, the viscosity of the insulation paste can be adjusted to a viscosity suitable for screen printing and the like. The amount of fillers in the insulation paste can herein be reduced to some extent to increase the proportion of the siloxane resin. As a result, a dense protective layer can be formed to thereby improve the barrier function of the protective layer. An extremely small amount of fillers, however, easily causes a crack if the siloxane resins bind to each other as condensation polymerization reaction proceeds in a firing process to be described later. The barrier function of the protective layer can thus easily be improved by setting the gross mass of the fillers so that concentration of the fillers in the insulation paste has a value of 5% by mass to 25% by mass, for example.

When the mass of the fillers is smaller than the mass of the siloxane resin in the insulation paste, the viscosity of the insulation paste can be adjusted to the viscosity suitable for screen printing and the like. The amount of fillers in the insulation paste is herein reduced to some extent to increase the proportion of the siloxane resin. This achieves a dense protective layer, and can thus improve the barrier function. A dense protective layer can easily be formed by including 3 parts by mass to 60 parts by mass of the fillers in 100 parts by mass of the siloxane resin, for example. A dense protective layer can more easily be formed by including 25 parts by mass to 60 parts by mass of the fillers in 100 parts by mass of the siloxane resin, for example.

For example, inorganic fillers containing a silicon oxide, an aluminum oxide, a titanium oxide and the like are adopted as the fillers included in the insulation paste according to one embodiment. Adoption of the fillers including, for example, the silicon oxide will improve compatibility, and thus the insulation paste is hardly gelatinized. Example shapes of the fillers to be adopted include particle shapes, layer shapes, flat shapes, hollow shapes, and fiber shapes. The fillers in such shapes can reduce the decrease in viscosity, which is caused by even dispersion of the fillers. Fillers not formed in the shape of spheres such as flat fillers have larger surface areas, and are thus easily aggregated with one another than fillers formed closer to the shape of spheres, for example. As a result, the fillers are hardly evenly dispersed.

An average grain diameter of the fillers is set to 1,000 nm or less, for example. The average grain diameter may be an average grain diameter of primary grains or an average grain diameter of secondary grains that are aggregated primary grains.

The organic solvent is a solvent for dispersing the siloxane resin and the fillers. One type or a plurality of types from among, for example, diethyleneglycolmonobutylether, methylcellosolve, ethylcellosolve, ethyl alcohol, 2-(4-methylcyclohexa-3-enyl)propane-2-ol, and 2-propanol can be used as the organic solvent.

When the concentration of the organic solvent ranges from 5% by mass to 90% by mass of the insulation paste, the viscosity of the insulation paste can be adjusted to the viscosity suitable for screen printing and the like. When the concentration of the organic solvent ranges from 5% by mass to 50% by mass of the insulation paste, for example, the viscosity of the insulation paste can easily be adjusted to the viscosity for screen printing and the like.

When the insulation paste does not substantially contain an organic binder, voids generated by decomposition of the organic binder and the like are reduced in the process of drying the insulation paste. This achieves a dense protective layer, and can thus improve the barrier function of the protective layer. However, less than 0.1 parts by mass of the organic binder may be contained in 100 parts by mass of the insulation paste.

When the viscosity of the insulation paste is set from 5 Pa·s to 400 Pa's at a shearing speed of 1 sec$^{-1}$, bleeding of the insulation paste can be reduced in applying the insulation paste in a desired pattern using screen printing. For example, the insulation paste can easily be applied in a shape with an opening whose width is approximately several tens of micrometers. The viscosity of the insulation paste can be measured using a viscosity-viscoelasticity measuring instrument, for example. The molecular weights of the siloxane resin and the organic coating can be measured by, for example, gel permeation chromatography (GPC), static light scattering (SLS), intrinsic viscosity (IV), vapor pressure osmometer (VPO) or the like. The compositions of the siloxane resin and the organic coating can be measured by, for example, the nuclear magnetic resonance (NMR), the infrared spectroscopy (IR), pyrolysis gas chromatography (PGC) or the like. Evolved gas analysis mass spectrometry (EGA-MS) can be used to measure both the molecular weights and the compositions of the siloxane resin and the organic coating. The number of carbon atoms and silicon atoms in the main chain of the organic coating can be measured by these measuring methods. In the measuring methods, the siloxane resin and the multiple fillers having surfaces covered with the organic coating may separately be measured.

For example, the siloxane resin and the multiple fillers having surfaces covered with the organic coating can be separated by centrifugal separation after dilution of the insulation paste with the organic solvent.

<Method for Producing Insulation Paste>

The method for producing the insulation paste according to one embodiment will be described below with reference to FIG. 1.

The insulation paste can be prepared by mixing together the precursor of the siloxane resin, water for causing a hydrolysis reaction of the precursor of the siloxane resin, a catalyst, the organic solvent, and multiple fillers having surfaces covered with the organic coating containing a material different from that of the siloxane resin.

First, a preparing process (step S1) is performed. Here, the precursor of the siloxane resin, water, a catalyst, the organic solvent, and the multiple fillers having surfaces covered with the organic coating containing a material different from that of the siloxane resin are prepared. For example, inorganic fillers containing a silicon oxide are used as the multiple fillers. For example, a material with a structure in which the number of carbon atoms in the main chain or the total number of carbon atoms and silicon atoms in the main chain is six or more is used as the material contained in the organic coating covering the surfaces of the fillers.

For example, mixing together a silane coupling agent, water, and a catalyst such as hydrochloric acid and covering the surfaces of the fillers with a resulting silane coupling agent obtained by hydrolysis of the OR structure enables the multiple fillers having the surfaces covered with the organic coating to be generated herein. The reaction temperature is set lower than 100° C. to suppress the volatilization of water.

Specifically, the multiple fillers having the surfaces covered with the organic coating can be generated by, for example, a dry treatment method. In the dry treatment method, first, approximately 1 part by mass of the silane coupling agent is prepared with respect to 100 parts by mass of the fillers. Next, the silane coupling agent is diluted 2-fold to 5-fold with water or an alcohol solution and fully stirred to be uniformly mixed. A silane coupling agent solution is generated accordingly. The alcohol solution to be used herein has, for example, 1:9 of a weight ratio of water to alcohol. Next, during stirring of the fillers, the silane coupling agent solution is dropped or sprayed through a spray to the fillers being stirred, for several ten minutes. The fillers are stirred by, for example, a stirring device such a Henschel mixer or a Loedige mixer. Then, the fillers to which the whole silane coupling agent solution has been added are stirred for ten minutes. Next, the fillers are spread to, for example, a tray and dried at a temperature ranging from 100° C. to 150° C. for 30 minutes to 90 minutes. When the dried fillers are aggregated, the aggregated fillers are ground by, for example, a ball mill. Consequently, the multiple fillers each having a surface covered with an organic coating containing a material different from that of the siloxane resin can be generated.

Furthermore, the multiple fillers having the surfaces covered with the organic coating can be generated by, for example, a slurry method (a wet treatment method). In the wet treatment method, first, the fillers and water or the alcohol solution are mixed into slurry. The alcohol solution to be used herein has, for example, 1:9 of a weight ratio of water to alcohol. Next, the silane coupling agent is added to the slurry prepared in the previous process. Here, approximately 1 part by mass of the silane coupling agent is added to 100 parts by mass of the fillers to be added. Then, the slurry to which the silane coupling agent has been added is stirred approximately for ten minutes. Then, the fillers subjected to the process with the silane coupling agent are extracted by filtering. Next, the fillers are spread to, for example, a hay and dried at a temperature ranging from 100° C. to 150° C. for 30 minutes to 90 minutes. When the dried fillers are aggregated, the aggregated fillers are ground by, for example, a ball mill. Consequently, the multiple fillers each having the surface covered with the organic coating containing a material different from that of the siloxane resin can be generated.

If the organic coating of the fillers is made of, for example, octylsilane, trimethoxy-n-octylsilane or triethoxyn-octylsilane, etc. is used as the silane coupling agent. If the organic coating of the fillers is made of, for example, a dodecyl group, chlorododecylsilane, dodecylchlorosilane, or dodecyltrimethoxysilane, etc. is used as the silane coupling agent. If the organic coating of the fillers is made of, for example, a hexadecyl group, hexadecyltrimethoxysilane, etc. is used as the silane coupling agent. Adoption of single-end reactive silicone oil expressed by the following general formula 3 as a replacement for the silane coupling agent enables the multiple fillers each having the surface covered with dimethylpolysiloxane as the organic coating to be generated. The following X forms the Si—O—Si bonds to the Si atoms on the surfaces of the fillers through, for example, a hydrolysis reaction to cover the surfaces of the fillers.

$$Me_3Si-(O-SiMe_2)_n-X \quad \text{(general formula 3)}$$

Me in the general formula 3 denotes the methyl group ($CH_3$). X denotes, for example, hydrogen (H), a vinyl group (—CH=$CH_2$), an amino group (—$NH_2$), a hydroxyl group (—OH), or an epoxy group (—C—C—O (*O is bonded to both Cs)). n denotes any natural number.

Next, a mixing process (step S2) is performed. The precursor of the siloxane resin, water for causing a hydrolysis reaction of the precursor of the siloxane resin, the catalyst, and the organic solvent are mixed together in a vessel to prepare a mixed solution.

Examples of the precursor of the siloxane resin include a hydrolysable compound having the Si—O bond or the Si—N bond, for example. The precursor of the siloxane resin undergoes hydrolysis and condensation polymerization to become the siloxane resin.

The hydrolysable compound having the Si—O bond as the precursor of the siloxane resin includes at least one silicon-containing compound. The silicon-containing compound is, for example, selected from the group consisting of siloxane resins obtained by hydrolysis and condensation polymerization of at least one type of alkoxysilane expressed by the following general formula 4:

$$(R1)_{4-n}Si(OR2) \quad \text{(general formula 4)}.$$

In the general formula 4, n is expressed by any integer from 1 to 4.

Examples of the hydrolysable compound having the Si—N bond as the precursor of the siloxane resin include an inorganic compound expressed by a chemical formula 3 such as polysilazane, and an organic compound expressed by a chemical formula 4 such as hexamethyldisilazane, which are indicated below:

$$-(H_2SiNH)_y- \quad \text{(chemical formula 3); and}$$

$$(CH_3)_3SiNHSi(CH_3)_3 \quad \text{(chemical formula 4)}.$$

In the chemical formula 3, y denotes any natural number.

Water is a liquid used for causing a hydrolysis reaction of the precursor of the siloxane resin. For example, pure water can be used.

The organic solvent is a solvent for dispersing the siloxane resin or the fillers to be described later. The organic solvent can be one type or a plurality of types from among, for example, diethyleneglycolmonobutylether, methylcellosolve, ethylcellosolve, ethyl alcohol, 2-(4-methylcyclohexa-3-enyl)propane-2-ol, and 2-propanol.

Inorganic acid or organic acid such as hydrochloric acid, nitric acid, sulfuric acid, boric acid, phosphoric acid, hydrofluoric acid, and acetic acid can be used as the catalyst. An inorganic base or an organic base such as ammonia, sodium hydroxide, potassium hydroxide, barium hydroxide, calcium hydroxide, and pyridine can also be used as the catalyst. The catalyst may be any combinations of one type or two or more types of the inorganic acid or the organic acid, or the inorganic base or the organic base.

The percentages of the materials mixed together in the mixing process are 10% by mass to 90% by mass of the precursor of the siloxane resin, 5% by mass to 40% by mass (or 10% by mass to 20% by mass) of water, 1 ppm to 1,000 ppm of the catalyst, and 5% by mass to 50% by mass of the organic solvent relative to the gross mass of these materials. The siloxane resin obtained by hydrolysis and condensation polymerization of the precursor of the siloxane resin can thereby be contained in the insulation paste at an appropriate mass percentage. Furthermore, the insulation paste is hardly gelatinized, and the excessive increase in viscosity of the insulation paste can be prevented.

In the mixing process, the precursor of the siloxane resin reacts with water to start hydrolysis of the precursor of the siloxane resin. The hydrolyzed precursor of the siloxane resin then undergoes condensation polymerization to start generation of the siloxane resin.

Next, a first stirring process (step S3) is performed. The mixed solution prepared in the mixing process is stirred with, for example, a mixing rotor or a stirrer. The precursor of the siloxane resin is further hydrolyzed by stirring the mixed solution. The hydrolyzed precursor of the siloxane resin then undergoes condensation polymerization to continuously generate the siloxane resin. The mixed solution is stirred with the mixing rotor, for example, under stirring conditions of the rotational speed of 400 rpm to 600 rpm and the stirring time of 30 minutes to 90 minutes. The precursor of the siloxane resin, water, the catalyst, and the organic solvent can uniformly be mixed together with the stirring under the stirring conditions.

Next, a by-product removing process (step S4) is performed. In this process, water, the catalyst, and a by-product of an organic component such as alcohol are volatilized. The by-product is generated by reaction of the organic solvent, the precursor of the siloxane resin, and water. By removing the by-product, variation of the viscosity of the insulation paste attributable to volatilization of the organic component can be reduced in storing the insulation paste or in continuously applying the insulation paste. If the insulation paste is printed by screen printing, variation of dimensions of a pattern in screen platemaking which is caused by the organic component dissolving an emulsion used in screen platemaking can be reduced. The hydrolyzed precursor of the siloxane resin undergoes condensation polymerization to continuously generate the siloxane resin also in the by-product removing process. The condensation polymerization reaction of the precursor of the siloxane resin, however, can be reduced by volatilization of water and the catalyst, and thus variation of the viscosity of a mixture can be reduced.

In the by-product removing process, the stirred mixed solution is treated using a hot plate, a drying oven, or the like under conditions of a treatment temperature ranging from room temperature to 90° C. (typically, 50° C. to 90° C.) and the treatment time of 10 minutes to 600 minutes, for example. The by-product can be removed when the treatment temperature is within the temperature range. The treatment time can be shortened and the productivity can be improved, because the organic component that is a by-product is more easily volatilized in the temperature range.

The treatment time can be shortened and the productivity can be improved, because the organic component that is the by-product is more easily volatilized with the by-product removing process performed under a reduced pressure.

The precursor of the siloxane resin remaining in the first stirring process without being hydrolyzed may be hydrolyzed in the by-product removing process.

Next, a filler adding process (step S5) is performed. The multiple fillers having surfaces covered with the organic coating prepared in the preparing process (step S1) are herein added to the mixed solution having been treated in the by-product removing process (step S4). Thus, the multiple fillers are mixed into the mixed solution. The filler adding process (step S5) is performed after the first stirring process (step S3) to easily adjust the viscosity of the mixed solution. The fillers are added thereto to produce the insulation paste including, for example, 3% by mass to 30% by mass of the fillers.

Next, a second stirring process (step S6) is performed. The mixed solution to which the fillers have been added is stirred with, for example, a rotation and revolution mixer. The mixed solution is stirred with the rotation and revolution mixer, for example, under conditions of the rotational speed of 800 rpm to 1,000 rpm and the stirring time of 1 minute to 10 minutes. The fillers can uniformly be dispersed in the mixed solution with the stirring under the conditions.

Next, a viscosity stabilizing process (step S7) is performed. The stirred mixed solution is herein kept in storage, for example, at room temperature for approximately 2 hours to 24 hours to stabilize the viscosity of the mixed solution. The viscosity stabilizing process can be omitted if the viscosity of the mixed solution is stabilized in the second stirring process.

The insulation paste can be prepared in the above-mentioned processes.

Although the filler adding process is performed after the first stirring process, the fillers may also be simultaneously added in the mixing process, for example. This eliminates the need for the filler adding process and the second stirring process, leading to increase in productivity.

The by-product removing process may not be performed. The insulation paste prepared without performing the by-product removing process can be applied by, for example, spraying.

<Solar Cell Device>

Figure 2:
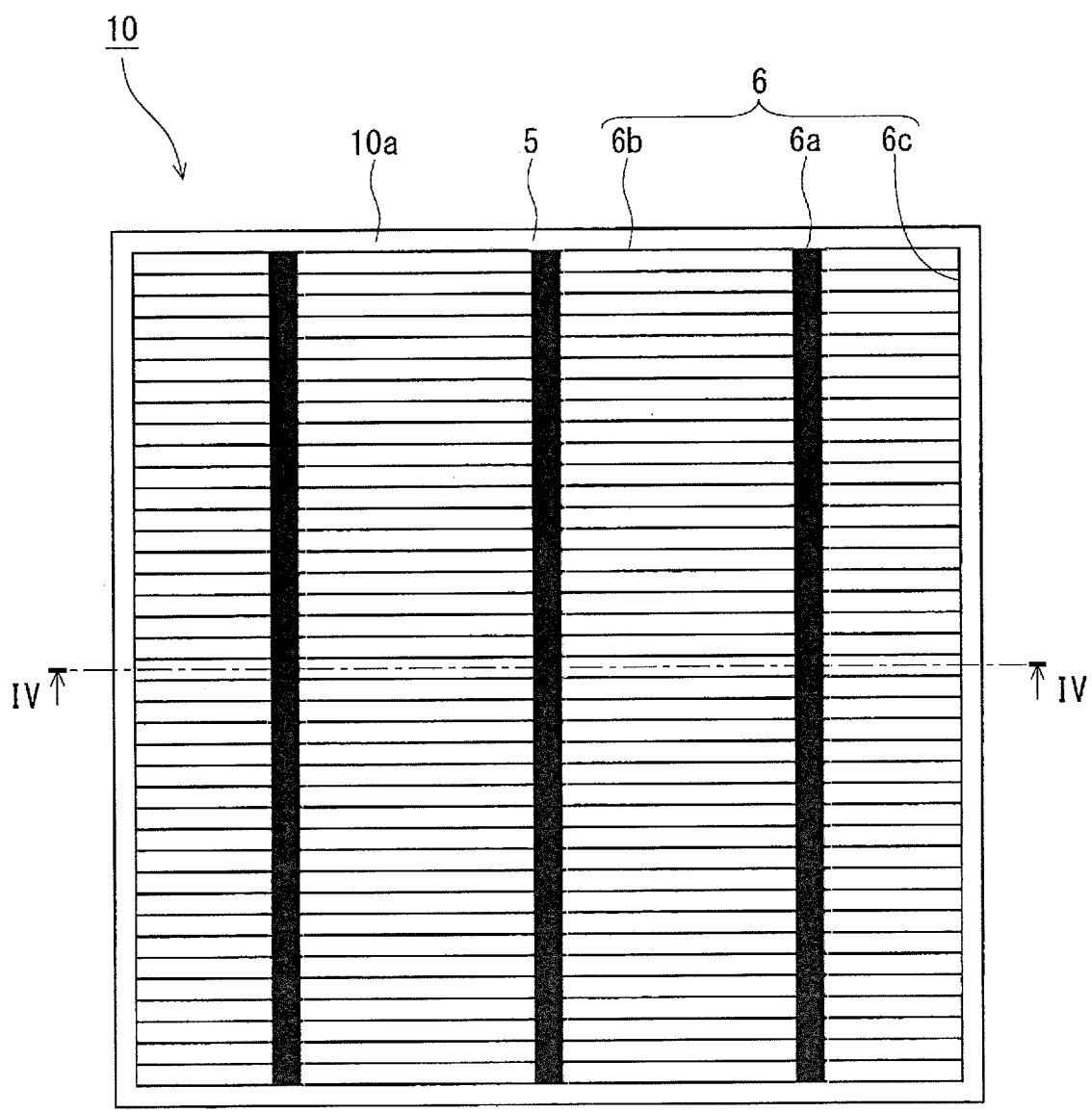
FIG. 2 illustrates a plan view showing the appearance of a solar cell device according to one embodiment on a first surface side.
Figure 3:
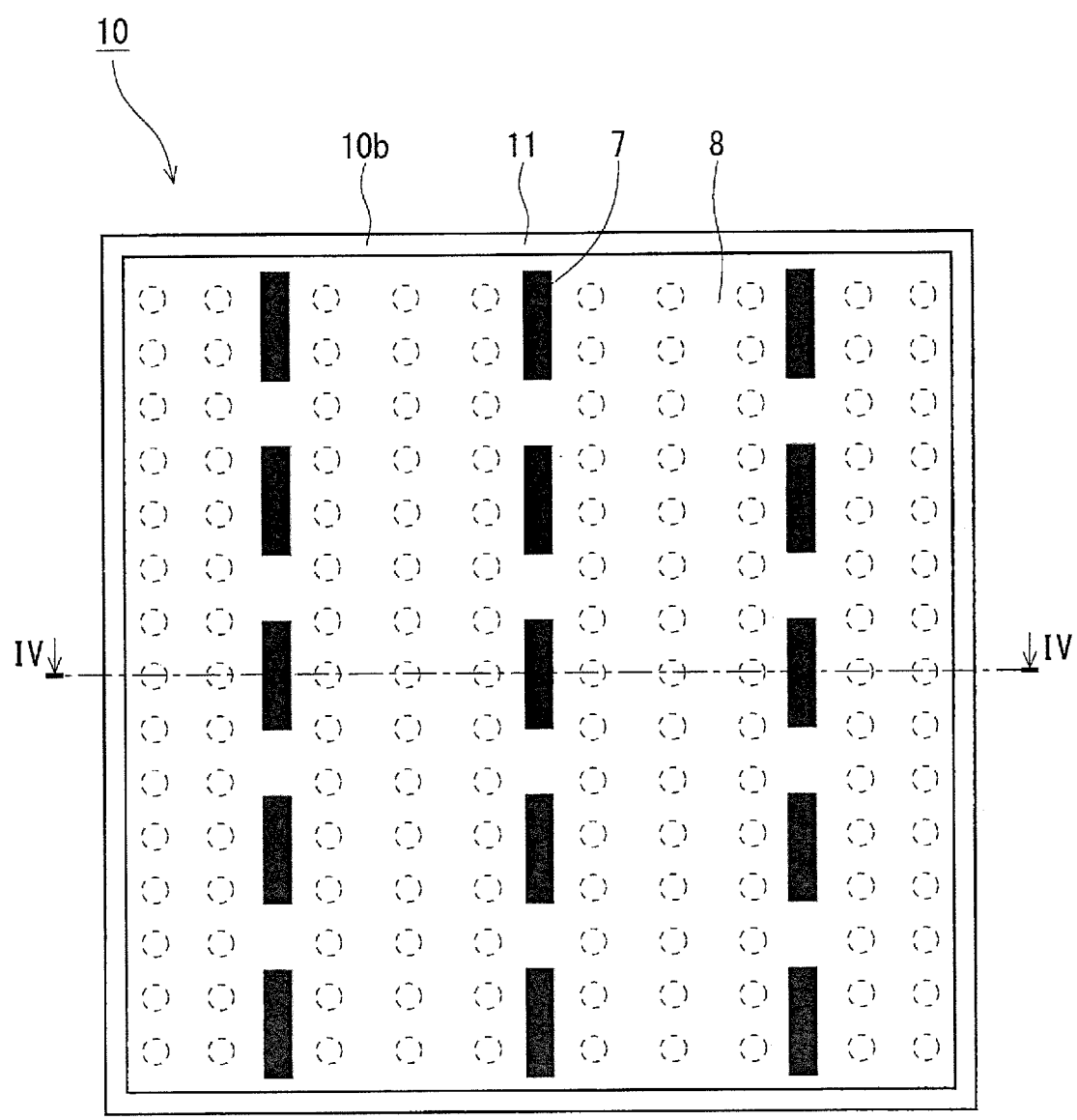
FIG. 3 illustrates a plan view showing the appearance of the solar cell device according to one embodiment on a second surface side.
Figure 4:
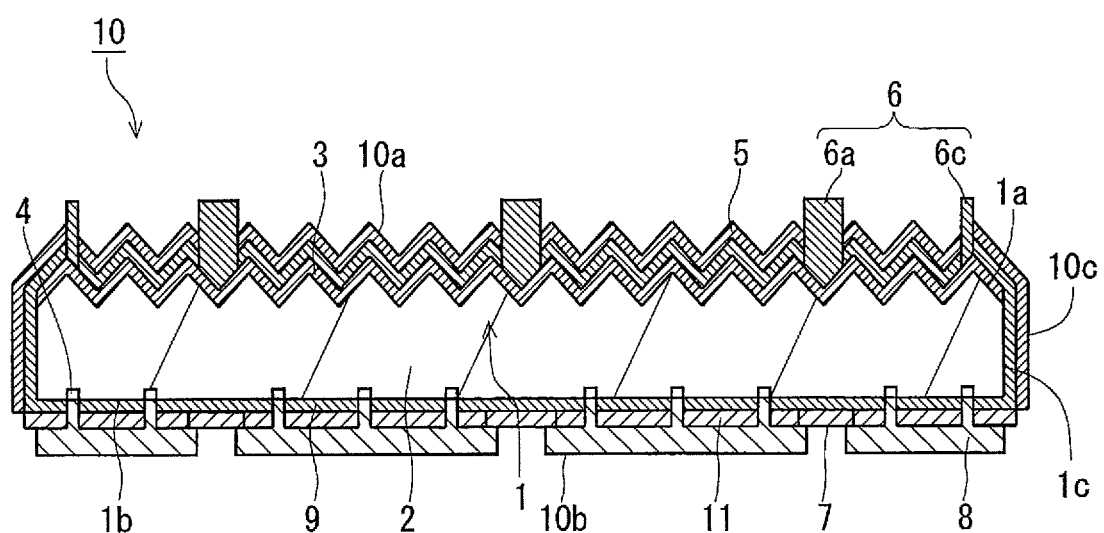
FIG. 4 illustrates a cross-sectional view showing a cross section of the solar cell device taken along the line IV-IV of FIGS. 2 and 3.

FIGS. 2 to 4 illustrate a solar cell device 10 according to one embodiment. The following will describe the one embodiment of application of the insulation paste according to the present disclosure to a passivated emitter rear cell (PERC) solar cell device.

As illustrated in FIG. 4, the solar cell device 10 has a first surface 10a which is a light-receiving surface through which light mainly enters, a second surface 10b located opposite the first surface 10a, and side surfaces 10c. The solar cell device 10 includes a silicon substrate 1 as a semiconductor substrate. The silicon substrate 1 has a first surface 1a, a second surface 1b located opposite the first surface 1a, and side surfaces 1c. The silicon substrate 1 has a first semiconductor layer 2 as a semiconductor region of one conductivity type (e.g., a p-type), and a second semiconductor layer 3 located on the first semiconductor layer 2 on the first surface 1a side as a semiconductor region of the opposite conductivity type (e.g., an n-type). The solar cell device 10 further includes a third semiconductor layer 4, an antireflection layer 5, a first electrode 6, second electrodes 7, a third electrode 8, a first passivation layer 9, and a protective layer 11.

The silicon substrate 1 is, for example, a monocrystalline silicon substrate or a polycrystalline silicon substrate. The silicon substrate 1 includes the first semiconductor layer 2, and the second semiconductor layer 3 located on the first semiconductor layer 2 on the first surface 1a side. The semiconductor substrate may be made of a material other than silicon as long as the semiconductor substrate has the first semiconductor layer 2 and the second semiconductor layer 3 as described above.

An example application of a p-type semiconductor as the first semiconductor layer 2 will be described below. A p-type silicon substrate is used as the silicon substrate 1 if the p-type semiconductor is used as the first semiconductor layer 2. The silicon substrate 1 can be a polycrystalline substrate or a monocrystalline substrate, for example, a substrate having a thickness of 250 μm or less, or a thin substrate having a thickness of 150 μm or less. When the shape of the silicon substrate 1, which is not particularly limited, is approximately quadrilateral in plan view, it will be convenient that gaps between the solar cell devices can be made small in manufacture of a solar cell module including a plurality of the solar cell devices 10. If the first semiconductor layer 2 consisting of the polycrystalline silicon substrate 1 is of the p-type, impurities such as boron and gallium are contained in the silicon substrate 1 as dopant elements.

The second semiconductor layer 3 is stacked on the first semiconductor layer 2. The second semiconductor layer 3 has the opposite conductivity type (the n-type in one embodiment) to that of the first semiconductor layer 2, and is located on the first semiconductor layer 2 on the first surface 1a side. The silicon substrate 1 thereby has a p-n junction at an interface between the first semiconductor layer 2 and the second semiconductor layer 3. The second semiconductor layer 3 can be formed by diffusing, as a dopant, impurities such as phosphorus on the first surface 1a side of the silicon substrate 1, for example.

As illustrated in FIG. 4, the first surface 1a side of the silicon substrate 1 may have a fine rough structure (texture) to reduce reflectance of incoming light. For example, the height of each protrusion of the texture ranges approximately from 0.1 μm to 10 μm, and the distance between apexes of the adjacent protrusions ranges approximately from 0.1 μm to 20 μm. Depressions of the texture may each be approximately spherical, and protrusions of the texture may each be pyramidal, for example. The "height of each protrusion" in FIG. 4, for example, refers to a distance between the apex of the protrusion and a reference line that is defined as an imaginary straight line passing through the bottoms of depressions, in a direction perpendicular to the reference line.

The antireflection layer 5 has a function of reducing reflectance of light applied to the first surface 10a of the solar cell device 10. The antireflection layer 5 includes, for example, a silicon oxide, an aluminum oxide, or a silicon nitride layer. The refractive index and the thickness of the antireflection layer 5 may be appropriately adopted to satisfy low-reflection conditions for light in sunlight whose wavelength range may contribute to electric power generation through its absorption by the silicon substrate 1. The antireflection layer 5 can have, for example, a refractive index of approximately 1.8 to 2.5 and a thickness of approximately 20 nm to 120 nm.

The third semiconductor layer 4 is located on the second surface 1b side of the silicon substrate 1, and may have the same conductivity type (the p-type in one embodiment) as that of the first semiconductor layer 2. The concentration of the dopant included in the third semiconductor layer 4 is higher than that in the first semiconductor layer 2. In other words, the third semiconductor layer 4 includes the dopant elements at a higher concentration than that of the dopant elements of the first semiconductor layer 2 to be doped to have one conductivity type. The silicon substrate 1 thus includes a semiconductor region having p-type conductivity (also referred to as a p-type semiconductor region) at the second surface 1b as one of the surfaces, for example. The third semiconductor layer 4 forms an internal field on the second surface 1b side of the silicon substrate 1. The photoelectric conversion efficiency is thereby hardly reduced by recombination of minority carriers at or near the second surface 1b of the silicon substrate 1. The third semiconductor layer 4 can be formed by diffusing dopant elements such as boron and aluminum on the second surface 1b side of the silicon substrate 1, for example. The concentration of the dopant elements included in the first semiconductor layer 2 can herein be set to approximately $5 \times 10^{15}$ atoms/cm$^3$ to $1 \times 10^{17}$ atoms/cm$^3$, and the concentration of the dopant elements included in the third semiconductor layer 4 can herein be set to approximately $1 \times 10^{18}$ atoms/cm$^3$ to $5 \times 10^{21}$ atoms/cm$^3$. The third semiconductor layer 4 may be present at the site of contact between the third electrode 8 to be described later and the silicon substrate 1.

The first electrode 6 is an electrode located on the first surface 1a side of the silicon substrate 1. As illustrated in FIG. 2, the first electrode 6 includes output extracting electrodes 6a and a plurality of linear collecting electrodes 6b. The output extracting electrodes 6a are electrodes for externally extracting electricity obtained by electric power generation. Each of the output extracting electrodes 6a has a length in its short direction (also referred to as a width) of approximately 1.3 mm to 2.5 mm, for example. At least part of the output extracting electrodes 6a crosses and is electrically connected to the collecting electrodes 6b. The collecting electrodes 6b are electrodes for collecting electricity obtained by electric power generation performed by the silicon substrate 1. Each of the collecting electrodes 6b has a width of approximately 50 μm to 200 μm, for example. As described above, each of the collecting electrodes 6b has a smaller width than that of the output extracting electrode 6a. The plurality of collecting electrodes 6b are located with a space of approximately 1 mm to 3 mm therebetween, for example. The first electrode 6 has a thickness of approximately 10 μm to 40 μm, for example. The first electrode 6 can be formed by applying a metal paste containing silver as a main component in a desired shape by screen printing or the like, and then firing the metal paste, for example. In one embodiment, the main component refers to a component accounting for 50% or more of all the components. Here, auxiliary electrodes 6c having the same shape as those of the collecting electrodes 6b may be located in a peripheral portion of the silicon substrate 1 to electrically connect the collecting electrodes 6b to each other, for example.

As illustrated in FIGS. 3 and 4, the second electrodes 7 and the third electrode 8 are located on the second surface 1b side of the silicon substrate 1. The second electrodes 7 are electrodes for externally extracting electricity obtained by electric power generation performed by the solar cell device 10. Each of the second electrodes 7 has a thickness of approximately 10 μm to 30 μm, for example. Each of the second electrodes 7 has a width of approximately 1.3 mm to 7.0 mm, for example.

The second electrodes 7 contain silver as a main component. The second electrodes 7 can be formed by applying a metal paste containing silver as a main component in a desired shape by screen printing or the like, and then firing the metal paste, for example.

As illustrated in FIGS. 3 and 4, the third electrode 8 is an electrode for collecting electricity generated by the silicon substrate 1 on the second surface 1b side of the silicon substrate 1. The third electrode 8 is located to be electrically connected to the second electrodes 7. At least part of the second electrodes 7 may be connected to the third electrode 8. The third electrode 8 has a thickness of approximately 15 μm to 50 μm, for example.

The third electrode 8 contains aluminum as a main component. The third electrode 8 can be formed by applying a metal paste containing aluminum as a main component in a desired shape and then firing the metal paste, for example.

The first passivation layer 9 is located at least on the second surface 1b of the silicon substrate 1. In other words, the first passivation layer 9 is located on the p-type semiconductor region of the silicon substrate 1. The first passivation layer 9 has a function of reducing recombination of the minority carriers. An aluminum oxide is adopted as an example material of the first passivation layer 9. The aluminum oxide contained in the first passivation layer 9 is formed by atomic layer deposition (ALD), for example. The aluminum oxide herein has negative fixed charge, so that this field effect moves the minority carriers (electrons in this case) on the second surface 1b side of the silicon substrate 1 away from an interface between the first semiconductor layer 2 of the p-type and the first passivation layer 9 (the second surface 1b as the surface of the silicon substrate 1). This reduces recombination of the minority carriers on the second surface 1b side of the silicon substrate 1. The photoelectric conversion efficiency of the solar cell device 10 can thereby be improved. The first passivation layer 9 has a thickness of approximately 10 nm to 200 nm, for example.

The protective layer 11 is located in a desired pattern on the first passivation layer 9 located on the first semiconductor layer 2. The protective layer 11 has a pattern having a plurality of openings in plan view. The openings may be in the shape of dots (points) or strips (lines), for example. Here, each of the openings may have a diameter or a width of approximately 10 μm to 500 μm, for example. The distance between the centers of adjacent openings in plan view (also referred to as a pitch of the openings) is approximately 0.3 mm to 3.0 mm, for example. In applying the metal paste containing aluminum as the main component to the protective layer 11 in the desired shape and firing the metal paste, the metal paste applied to the first passivation layer 9 located in the openings where the protective layer 11 is not formed fires through the first passivation layer 9 during firing. The metal paste is thus electrically connected to the silicon substrate 1 to form the third semiconductor layer 4. On the other hand, the metal paste does not fire through the first passivation layer 9 during firing in a region of the first passivation layer 9 covered with the protective layer 11. The passivation effect produced by the first passivation layer 9 is thus hardly reduced. The protective layer 11 has a thickness of approximately 0.5 μm to 10.0 μm, for example. The thickness of the protective layer 11 is appropriately changed according to, for example, the type or the content of a component of the insulation paste, the size of the roughness on the second surface 1b of the silicon substrate 1, the type or the content of a glass fit contained in the metal paste, and the firing conditions during formation of the third electrode 8. The protective layer 11 is formed by applying the above-mentioned insulation paste by screen printing, and drying the insulation paste, for example.

In one embodiment, the protective layer 11 contains a silicon oxide as a main component. Specifically, the protective layer 11 contains, for example, the siloxane resin and a component derived from a component of the organic coating covering the multiple fillers included in the insulation paste. For example, the protective layer 11 may contain the siloxane resin, and an organic component that is different from the siloxane resin and has a structure in which the number of carbon atoms in the main chain or the total number of carbon atoms and silicon atoms in the main chain is six or more.

For example, the protective layer 11 may contain the siloxane resin, and, for example, an alkyl group or octylsilane which is derived from a component of the organic coating covering the multiple fillers and in which the number of carbon atoms in the main chain is six or more. Even upon reaction with the OH group, the polarity hardly occurs in the alkyl group or octylsilane in which the number of carbon atoms in the main chain is six or more. Thus, the protective layer 11 can maintain hydrophobicity. Consequently, the film quality of the protective layer 11 is hardly changed by moisture and the like, which increases the durability of the protective layer 11. The protective layer 11 can thus improve the function of protecting the first passivation layer 9. As a result, the quality of the first passivation layer 9 of the solar cell device is maintained, leading to improve in the quality of the first passivation layer 9.

The protective layer 11 may contain the siloxane resin and dimethylpolysiloxane including a —(O—Si—(CH$_3$)$_2$)-bond and a —(Si—(CH$_3$)$_3$) bond, for example. Here, dimethylpolysiloxane is terminated by the methyl group (CH$_3$). Dimethylpolysiloxane has a spiral and linear main chain and has the methyl group (CH$_3$) at the surface thereof to have hydrophobicity, for example. Dimethylpolysiloxane, for example, terminated by CH$_3$ is stabilized and has no polarity. This allows for obtainment of hydrophobicity of dimethylpolysiloxane. Furthermore, dimethylpolysiloxane terminated by CH$_3$ is stabilized, and thus hardly reacts with the OH group. The film quality of the protective layer 11 is hardly changed by moisture and the like. Thus, the protective layer 11 maintains its insulating characteristics to hardly allow the leakage current to flow.

Even when the main chain of dimethylpolysiloxane is broken by a high temperature treatment in the firing for forming the electrodes, the portion where the main chain is broken forms a Si—OH bond. This Si—OH bond rebinds to surrounding Si—OH bonds through reaction. Thus, the influence on the first passivation layer 9 caused by the high temperature treatment is reduced, and a malfunction that weakens the field passivation effect produced by the first passivation layer 9 hardly occurs. The siloxane bond (Si—O—Si bond) in dimethylpolysiloxane does not decompose at, for example, at least 200° C. or less, and hardly decomposes even through exposure to light. The siloxane bond (Si—O—Si bond) is more stable than a C—C bond in, for example, the alkyl group. Specifically, if the number of carbon (C) atoms in the alkyl group is two or more, the binding energy in the C—C bond in the main chain is 365 kJ/mol. On the other hand, the binding energy between the silicon atoms and the oxygen atom in the siloxane bond (Si—O—Si bond) of dimethylpolysiloxane is 444 kJ/mol. The main chain of the siloxane bond is less broken than that of the C—C bond even at high temperatures in the firing. In other words, dimethylpolysiloxane is more stable than the alkyl group.

As described above, an O—Si bond in the siloxane bond (Si—O—Si bond) in dimethylpolysiloxane has higher binding energy than that of the C—C bond in, for example, the alkyl group. For this reason, for example, dimethylpolysiloxane can be highly electrically insulated because electrons contributing to binding of atoms hardly become free electrons for flow of current in dimethylpolysiloxane than those in, for example, the alkyl group. The insulating characteristics of dimethylpolysiloxane are easily improved, because dimethylpolysiloxane is a polymeric compound and has a larger range where no free electron exists. Dimethylpolysiloxane causes the leakage current to hardly flow through even, for example, a portion with the protective layer 11 formed thinner. For example, the protective layer 11 containing dimethylpolysiloxane hardly influences the field passivation effect produced by the first passivation layer 9, because the polarity of dimethylpolysiloxane is closer to zero.

Dimethylpolysiloxane is more resistant to oxidizing and decomposition and more stable than the alkyl group, for example, even under a temperature environment approximately at 150° C. in an oxidizing atmosphere. For example, even with the exposure to sunlight, the light absorption causes dimethylpolysiloxane to decompose less than it does the alkyl group. Thus, the protective layer 11 containing dimethylpolysiloxane easily maintains moisture permeability.

Dimethylpolysiloxane reacts to a solution containing halogen atoms except for hydrofluoric acid less than the alkyl group does. Even when, for example, an acid used in the processes of manufacturing the solar cell device remains in the solar cell device, the protective layer 11 containing dimethylpolysiloxane is relatively stable. Thus, the protective layer 11 containing dimethylpolysiloxane can reduce deterioration in the quality of the first passivation layer 9 in the solar cell device 10 than by the protective layer 11 containing the alkyl group. In other words, the quality of the first passivation layer 9 of the solar cell device 10 can be improved.

Dimethylpolysiloxane in the protective layer 11 is identifiable by measurement by Fourier transform infrared spectroscopy (FT-IR), for example.

The solar cell device 10 is used as a solar cell module sealed by, for example, a transparent substrate, a back sheet made of a resin, and a sealing member made of an ethylene-vinyl acetate copolymer (EVA) filled between the transparent substrate and the back sheet. Here, the back sheet made of a resin is softened in a temperature range from room temperature to approximately 100° C., for example. The back sheet and the sealing member can be then cut to peel off the back sheet and the sealing member that are located on the rear surface of the solar cell device 10. The sealing member can be peeled from a light-receiving surface side of the solar cell device 10 by inserting fine metal wire and the like between the solar cell device 10 and the sealing member from a peripheral portion of the solar cell device 10, for example. The sealing member may be peeled from the solar cell device 10 by breaking the solar cell device 10 into fragments, for example. The third electrode 8 of the solar cell device 10 separated from the sealing member can be then removed by grinding or etching using hydrochloric acid and the like to expose the protective layer 11 for measurement by FT-IR.

Dimethylpolysiloxane is identifiable by referring to spectra having wave numbers around 1250 cm$^{-1}$ to 1300 cm$^{-1}$ from among spectra having wave numbers obtained by the measurement by FT-IR, for example. Specifically, in the spectra of the measurement values having wave numbers around 1250 cm$^{-1}$ to 1300 cm$^{-1}$, the peak measurement value corresponding to the Si—CH$_3$ bond in the siloxane resin appears in the wave numbers around 1270 cm$^{-1}$. Increase in the measurement value corresponding to the binding of two methyl groups ($CH_3$) per Si in the main chain of dimethylpolysiloxane can appear in the wave numbers around 1260 $cm^{-1}$. Furthermore, binding of three methyl groups ($CH_3$) per Si at the terminal portion of dimethylpolysiloxane can be identified by, for example, the NMR. If, for example, only a material excluding the alkyl group such as polysilazane is used as a precursor of the siloxane resin and a coating component of the fillers is limited to dimethylpolysiloxane, the insulation paste does not include a binding of only one alkyl group (R) per silicon (Si). Here, the peak in the wave numbers around, for example, 1270 $cm^{-1}$ is not detected, and increase in the measurement value in the wave numbers around 1260 $cm^{-1}$ and 1250 $cm^{-1}$ is easily seen. In other words, dimethylpolysiloxane in the protective layer 11 can be easily identified.

Dimethylpolysiloxane in the protective layer 11 may be identified even by the other analyses such as the EGA-MS and the Time-of-Flight Secondary Ion Mass Spectrometry (TOF-SIMS).

Adhesion between the protective layer 11 and the other portions adjacent to the protective layer 11 (the adjacent portions) can be improved when at least one of the Si—OH bond and the Si—OR bond included in the insulation paste remains in the protective layer 11, for example. The adjacent portions include the third electrode 8 and the first passivation layer 9, for example. For example, OH exists on the surfaces of aluminum (Al) and silicon (Si). When the Si—OR bond exists at the surface of the protective layer 11, R and OH react with each other to emit alcohol, thereby forming the siloxane bond (Si—O—Si bond), an Si—O—Al bond, and the like. When the Si—OH bond exists at the surface of the protective layer 11, H and OH react with each other to emit water, thereby forming the siloxane bond (Si—O—Si bond), the Si—O—Al bond, and the like. Adhesion between the protective layer 11 and the other portions adjacent to the protective layer 11 (the adjacent portions) can thus be improved.

The Si—OH bond in the protective layer 11 is identifiable by the measurement by FT-IR, for example. The Si—OR bond in the protective layer 11 is identifiable by the measurement by NMR, for example. The insulation paste and the protective layer 11 can include the Si—OH bond when, for example, the precursor of the siloxane resin contains a material expressed by the following general formula 5 in preparing the insulation paste:

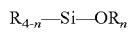  (general formula 5).

In the general formula 5, n is a natural number from 1 to 4. R denotes the alkyl group. The name of a substance expressed by the general formula 5 is changed, depending on the value of n and R that denotes the type of the alkyl group. For example, when R denotes the methyl group, the substance is trimethylmethoxysilane where n=1, dimethyldimethoxysilane where n=2, methyltrimethoxysilane where n=3, or tetramethoxysilane where n=4. The "—OR" denotes a methoxy group.

The protective layer 11 may be formed not only on the first passivation layer 9 formed on the second surface 1b side of the silicon substrate 1, but also on the antireflection layer 5 formed on the side surfaces 1c and a peripheral portion of the first surface 1a of the silicon substrate 1, for example. Here, the leakage current in the solar cell device 10 can be reduced, depending on the placement of the protective layer 11.

A second passivation layer containing a silicon oxide may be formed between the p-type semiconductor region (the first semiconductor layer 2 in one embodiment) and the first passivation layer 9 including the aluminum oxide layer, for example. This can improve passivation performance. A second passivation layer having a thickness of approximately 0.1 nm to 1.0 nm hardly reduces the field passivation effect produced by the first passivation layer 9, even when the second passivation layer, which includes the silicon oxide, has positive fixed charge.

The third electrode 8 may be formed on the second surface 1b of the solar cell device 10 in the shape of the collecting electrodes 6b to be connected to the second electrodes 7, for example. Such a structure enables, for example, light reflected from the ground and the like and entering the rear surface side of the solar cell module to contribute to electric power generation and thereby improve output of the solar cell module.

A silicon oxide layer formed by ALD may further be located between the protective layer 11 and the first passivation layer 9 including the aluminum oxide layer, for example. As the silicon oxide layer is formed by ALD, the silicon oxide layer is denser than the protective layer 11. The state of the silicon oxide layer denser than the protective layer 11 can be observed by a Transmission Electron Microscope (TEM). The silicon oxide layer formed between the first passivation layer 9 and the protective layer 11 functions as a buffer layer between the first passivation layer 9 and the protective layer 11. Adhesion between the first passivation layer 9 and the protective layer 11 can thus further be improved. The silicon oxide layer may be approximately 5 nm to 15 nm in thickness. A silicon oxide layer having a thickness in the above-mentioned range hardly reduces the field passivation effect produced by negative fixed charge of the first passivation layer 9, even when the silicon oxide layer has positive fixed charge. The silicon oxide layer, however, should have a thickness smaller than that of the first passivation layer 9.

<Method for Manufacturing Solar Cell Device>

Each process of the method for manufacturing the solar cell device 10 will be described in detail with reference to FIGS. 5 to 10.

Figure 5:
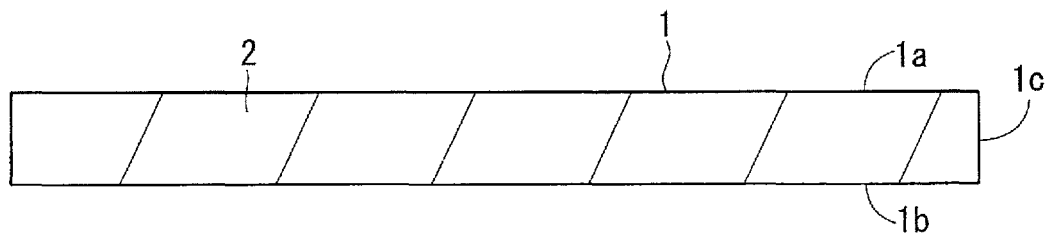
FIG. 5 illustrates an enlarged end view showing a state of the solar cell device according to one embodiment during manufacture.

First, the silicon substrate 1 is prepared as illustrated in FIG. 5. The silicon substrate 1 is formed by the Czochralski (CZ) method, a casting method or the like which already exists, for example. An example in which a p-type polycrystalline silicon substrate is used as the silicon substrate 1 will be described below.

An ingot of polycrystalline silicon is herein prepared by casting, for example. Next, the ingot is cut into slices each having a thickness of 250 μm or less, for example, to prepare the silicon substrate 1. Then, in order to remove a mechanically-damaged layer and a contaminated layer of the cut surface of the silicon substrate 1, the surface of the silicon substrate 1 may be slightly etched with an aqueous solution of NaOH, KOH, hydrofluoric acid, hydrofluoric-nitric acid, or the like.

Figure 6:
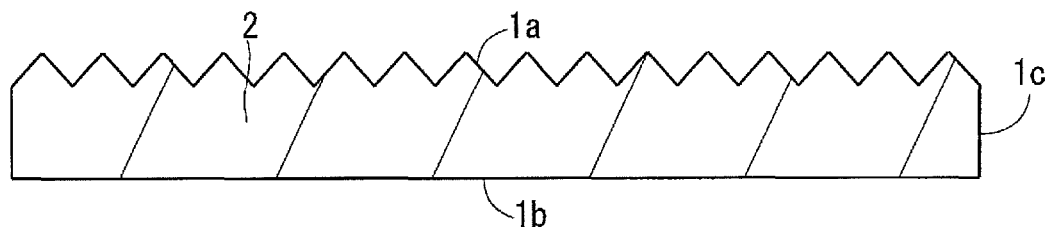
FIG. 6 illustrates an enlarged end view showing a state of the solar cell device according to one embodiment during manufacture.

Next, the texture is formed on the first surface 1a of the silicon substrate 1 as illustrated in FIG. 6. The texture can be formed by wet etching using an alkaline solution of NaOH and the like or an acid solution of hydrofluoric-nitric acid and the like, or by dry etching such as reactive ion etching (RIE), for example.

Figure 7:
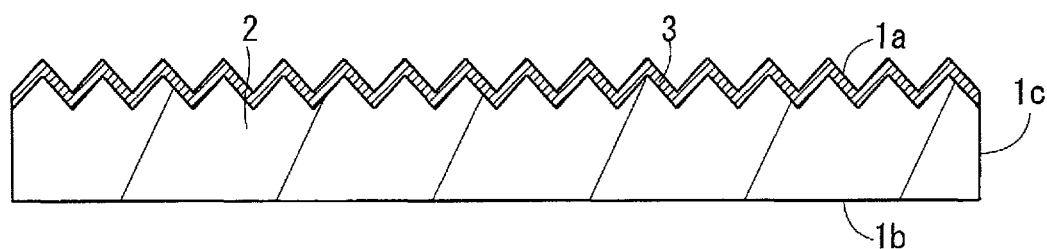
FIG. 7 illustrates an enlarged end view showing a state of the solar cell device according to one embodiment during manufacture.

Next, a process of foil ling the second semiconductor layer 3 as an n-type semiconductor region is performed with respect to the first surface 1a of the silicon substrate 1 having the texture formed in the above-mentioned process, as illustrated in FIG. 7. Specifically, the second semiconductor layer 3 of the n-type is formed in a surface layer of the silicon substrate 1 on the first surface 1a side having the texture.

The second semiconductor layer 3 can be formed by application thermal diffusion in which a $P_2O_5$ (diphosphorus pentaoxide) paste is applied onto the surface of the silicon substrate 1 and phosphorus is thermally diffused, or by gas phase thermal diffusion using a $POCl_3$ (phosphorus oxychloride) gas as the source of diffusion, for example. The second semiconductor layer 3 is formed to have a depth of approximately 0.1 μm to 2 μm and a sheet resistance of approximately 40 Ω/□ to 200 Ω/□. In the gas phase thermal diffusion, the silicon substrate 1 is heat treated in an atmosphere of a diffused gas including $POCl_3$ and the like in a temperature range of approximately 600° C. to 800° C. for approximately 5 minutes to 30 minutes to form phosphorus glass on the surface of the silicon substrate 1, for example. The silicon substrate 1 is then heat treated in an atmosphere of an inert gas such as argon or nitrogen at a high temperature of approximately 800° C. to 900° C. for approximately 10 minutes to 40 minutes. Phosphorus is thereby diffused from the phosphorus glass into the surface layer of the silicon substrate 1 to form the second semiconductor layer 3 on the first surface 1a side of the silicon substrate 1.

Next, if the second semiconductor layer is also formed on the second surface 1b side in the above-mentioned process of forming the second semiconductor layer 3, only the second semiconductor layer formed on the second surface 1b side is removed by etching, for example. A p-type conductivity region is thereby exposed on the second surface 1b side. The second semiconductor layer formed on the second surface 1b side can be removed by immersing only the second surface 1b side of the silicon substrate 1 in a hydrofluoric-nitric acid solution, for example. The phosphorus glass adhering to the first surface 1a side of the silicon substrate 1 is then removed by etching.

Removal of and damage to the second semiconductor layer 3 on the first surface 1a side can be reduced by removing the second semiconductor layer formed on the second surface 1b side by etching while allowing the phosphorus glass to remain on the first surface 1a side as described above. Here, the second semiconductor layer formed on the side surfaces 1c of the silicon substrate 1 may also be removed.

In the process of forming the second semiconductor layer 3, for example, a diffusion mask may be formed in advance on the second surface 1b side to form the second semiconductor layer 3 by gas phase thermal diffusion and the like, and then the diffusion mask may be removed. A structure similar to the above-mentioned structure can be formed in this process. Here, the process of removing the second semiconductor layer on the second surface 1b side is unnecessary because the second semiconductor layer is not formed on the second surface 1b side.

The polycrystalline silicon substrate 1 including the second semiconductor layer 3 as the n-type semiconductor layer formed on the first surface 1a side, and the first semiconductor layer 2 having the texture on its surface can be prepared in the above-mentioned manner.

Figure 8:
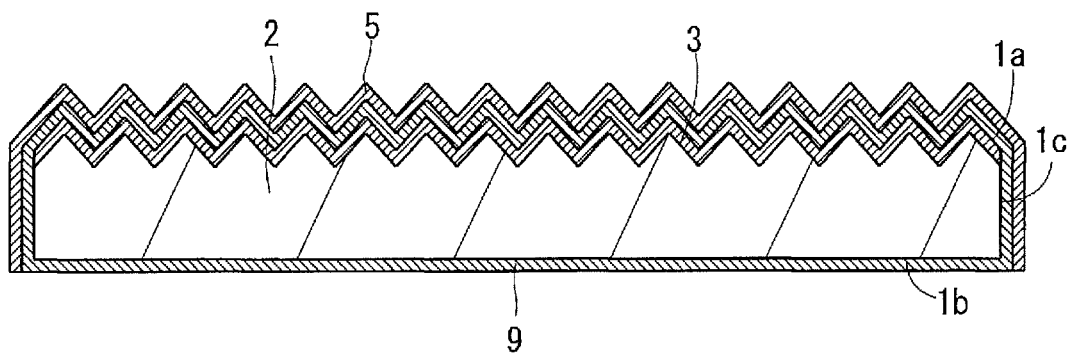
FIG. 8 illustrates an enlarged end view showing a state of the solar cell device according to one embodiment during manufacture.

Next, the first passivation layer 9 is formed on the first surface 1a of the second semiconductor layer 3 and the second surface 1b of the first semiconductor layer 2 as illustrated in FIG. 8. The first passivation layer 9 mainly contains an aluminum oxide, for example. The antireflection layer 5 is formed on the first passivation layer 9. The antireflection layer 5 mainly contains a silicon nitride film, for example.

The first passivation layer 9 can be formed by ALD, for example. The first passivation layer 9 can be formed by ALD on the entire surface of the silicon substrate 1 including the side surfaces 1c of the silicon substrate 1. In forming the first passivation layer 9 by ALD, the silicon substrate 1 in which the second semiconductor layer 3 has been formed is first placed in a chamber of a layer formation apparatus, for example. The following processes A to D are repeated a plurality of times while heating the silicon substrate 1 to a temperature range of 100° C. to 250° C. to form the first passivation layer 9 containing the aluminum oxide. The first passivation layer 9 having a desired thickness is thereby formed.

If the second passivation layer including the silicon oxide is formed between the first semiconductor layer 2 and the first passivation layer 9 containing the aluminum oxide, the second passivation layer can be formed by ALD. In this case, the second passivation layer including the silicon oxide can be formed by repeating the following processes A to D a plurality of times while heating the silicon substrate 1 to a temperature range similar to the above-mentioned temperature range. Details of the processes A to D are as follows:

[Process A] A silicon material, such as bisdiethylaminosilane (BDEAS), for formation of a silicon oxide layer or an aluminum material, such as trimethylaluminum (TMA), for formation of an aluminum oxide is supplied to the silicon substrate 1 along with a carrier gas such as an Ar gas and a nitrogen gas. The silicon material or the aluminum material is thereby absorbed onto the entire surface of the silicon substrate 1. A time to supply the BDEAS or the TMA may be approximately 15 msec to 3,000 msec, for example.

The surface of the silicon substrate 1 may be terminated by the OH group at the start of the process A. In other words, the surface of the silicon substrate 1 may have an Si—O—H structure. This structure can be formed by cleaning the silicon substrate 1 with pure water after treatment with diluted hydrofluoric acid, for example.

[Process B] The chamber of the layer formation apparatus is purified with a nitrogen gas to remove the silicon material or the aluminum material in the chamber. A silicon material or an aluminum material other than a component chemically absorbed at an atomic layer level is further removed from the silicon material or the aluminum material physically and chemically absorbed onto the silicon substrate 1. The chamber is purified with the nitrogen gas for approximately one second to dozens of seconds, for example.

[Process C] An oxidizer, for example, water or an ozone gas is supplied into the chamber of the layer formation apparatus to remove the alkyl group included in BDEAS or TMA so that the OH group is substituted for the alkyl group. An atomic layer of a silicon oxide or an aluminum oxide is thereby formed on the silicon substrate 1. The oxidizer may be supplied into the chamber for approximately 750 msec to 1,100 msec, for example. Hydrogen atoms are easily included in the silicon oxide or the aluminum oxide by supplying hydrogen (H) along with the oxidizer into the chamber, for example.

[Process D] The chamber of the layer formation apparatus is purified with a nitrogen gas to remove the oxidizer in the chamber. Here, for example, an oxidizer not having contributed to reaction during formation of the silicon oxide or the aluminum oxide at the atomic layer level on the silicon substrate 1 is removed. The chamber may be purified with the nitrogen gas for approximately one second to dozens of seconds, for example.

A series of the processes A to D is thereafter repeated a plurality of times to form the silicon oxide layer or the aluminum oxide layer having a desired thickness.

The antireflection layer 5 can be formed by PECVD or sputtering, for example. If PECVD is applied, the silicon substrate 1 is preheated at a temperature higher than a temperature at which the antireflection layer 5 is formed, for example. Then, a mixed gas of silane ($SiH_4$) and ammonia ($NH_3$) is diluted with nitrogen ($N_2$). The diluted gas is plasmatized by glow discharge decomposition at a reaction pressure of 50 Pa to 200 Pa, and deposited on the heated silicon substrate 1 to form the antireflection layer 5. Here, the antireflection layer 5 is formed at a temperature of approximately 350° C. to 650° C., and the preheating temperature is set higher than the layer forming temperature by approximately 50° C. A frequency of a high-frequency power supply required for glow discharge is set to 10 kHz to 500 kHz. A flow rate of the gas is appropriately determined in accordance with the size of the reaction chamber and the like. The flow rate of the gas may range from 150 ml/min (sccm) to 6,000 ml/min (sccm), and a ratio (B/A) of the flow rate B of ammonia to the flow rate A of silane may be 0.5 to 15, for example.

Figure 9:
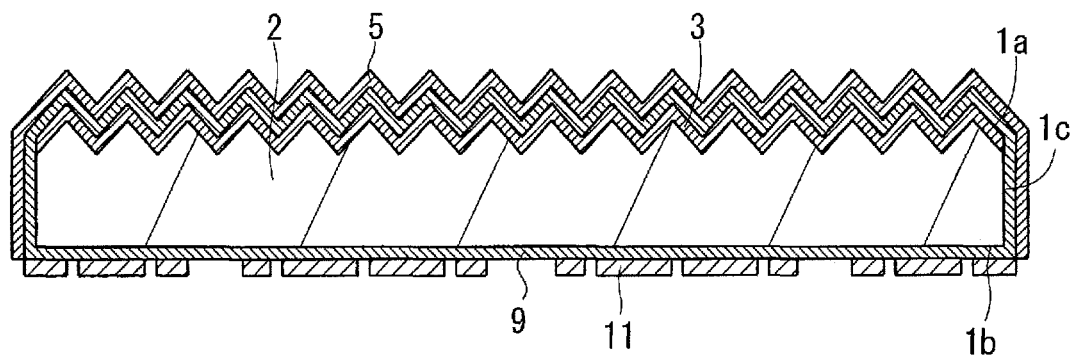
FIG. 9 illustrates an enlarged end view showing a state of the solar cell device according to one embodiment during manufacture.

Next, the protective layer 11 is formed on at least part of the first passivation layer 9 as illustrated in FIG. 9. For example, the insulation paste according to the present disclosure is applied to at least part of the first passivation layer 9 in a desired pattern by screen printing and the like. The insulation paste is then dried under conditions of the maximum temperature of 150° C. to 350° C. and a heating time of 1 minute to 10 minutes using a hot plate, a drying oven, or the like. The protective layer 11 in the desired pattern can thereby be formed on the first passivation layer 9. With the protective layer 11 formed under such conditions, a portion of the first passivation layer 9 covered with the protective layer 11 is not fired through during formation of the third electrode 8 to be described later, for example. The passivation effect produced by the first passivation layer 9 is thus hardly reduced. In addition, for example, adhesion between the protective layer 11, the first passivation layer 9, and the third electrode 8 is hardly reduced. The protective layer 11 formed under the conditions less adversely affects the quality of the first passivation layer 9 on the second surface 1b side than the protective layer 11 formed by PECVD. In other words, the quality of the first passivation layer 9 can be improved.

The protective layer 11 may be formed at a position other than a position at which the third electrode 8 is in contact with the second surface 1b of the silicon substrate 1, for example. The protective layer 11 formed in the desired pattern with a plurality of openings on the first passivation layer 9 eliminates the need for the process of removing the protective layer 11 through emission of a laser beam and the like. This can improve the productivity of the solar cell device 10.

The amount of the insulation paste to be applied is appropriately changed according to, for example, the size of the roughness on the second surface 1b of the silicon substrate 1, the type and the content of the glass frit contained in the metal paste containing aluminum as a main component to be described later, and the firing conditions during formation of the third electrode 8.

Figure 10:
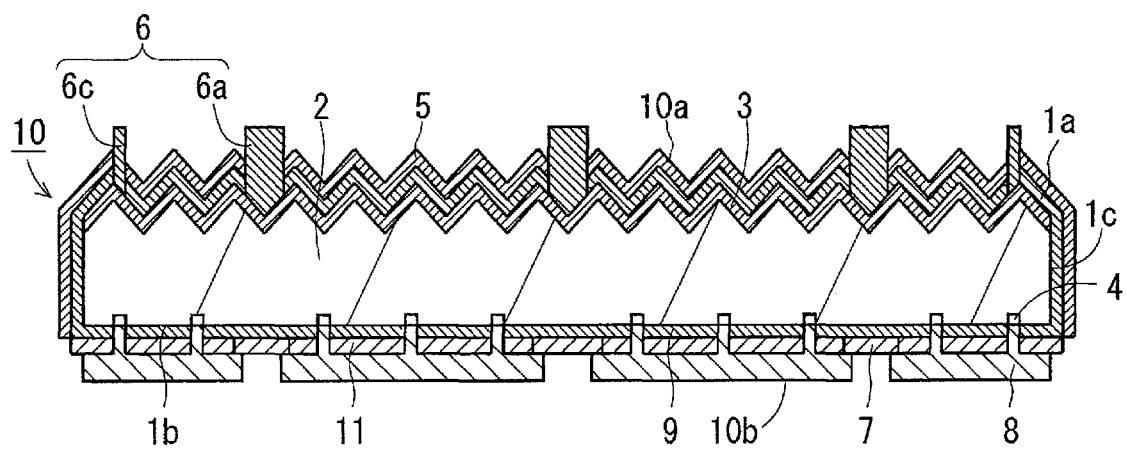
FIG. 10 illustrates an enlarged end view showing a state of the solar cell device according to one embodiment during manufacture.

Next, as illustrated in FIG. 10, the first electrode 6, the second electrodes 7, and the third electrode 8 are formed as described below.

The first electrode 6 can be prepared using a metal paste (also referred to as a first metal paste) including a metal powder containing silver as a main component, an organic vehicle, and a glass frit, for example. First, the first metal paste is herein applied to the first surface 1a of the silicon substrate 1 by screen printing or the like. The first metal paste may be dried by vaporizing a solvent at a predetermined temperature after application to the first surface 1a. The first metal paste is then fired in a firing oven under conditions of the maximum temperature of 600° C. to 850° C. and the heating time of approximately dozens of seconds to dozens of minutes to form the first electrode 6. The output extracting electrodes 6a and the collecting electrodes 6b that are included in the first electrode 6 can be formed in the same process by using screen printing.

The second electrodes 7 can be prepared using a metal paste (also referred to as a second metal paste) including a metal powder containing silver as a main component, an organic vehicle, and a glass frit, for example. First, the second metal paste is herein applied to a portion on the second surface 1b side of the silicon substrate 1 by screen printing or the like. The second metal paste may be dried after application by vaporizing a solvent at a predetermined temperature. The second metal paste is then fired in a firing oven under conditions of the maximum temperature of 600° C. to 850° C. and the heating time of approximately dozens of seconds to dozens of minutes to form the second electrodes 7 on the second surface 1b side of the silicon substrate 1.

The third electrode 8 can be prepared using a metal paste (also referred to as a third metal paste) including a metal powder containing aluminum as a main component, an organic vehicle, and a glass frit, for example. First, the third metal paste is herein applied to a portion on the second surface 1b side of the silicon substrate 1 to be in contact with a portion of the second metal paste applied in advance. Here, the third metal paste may be applied to almost the entire surface of the portion of the silicon substrate 1 on the second surface 1b side except for a part of the portion at which the second electrodes 7 are formed. The third metal paste can be applied by screen printing or the like. The third metal paste may be dried after application by vaporizing a solvent at a predetermined temperature. The third metal paste is then fired in a firing oven under conditions of the maximum temperature of 600° C. to 850° C. and the heating time of approximately dozens of seconds to dozens of minutes to form the third electrode 8 on the second surface 1b side of the silicon substrate 1. In this firing, the third metal paste fires through the first passivation layer 9 to be connected to the first semiconductor layer 2, so that the third electrode 8 is formed. The third semiconductor layer 4 is formed together with the third electrode 8. In contrast, the third metal paste disposed on the protective layer 11 is blocked by the protective layer 11. The first passivation layer 9 has little adverse effect during firing of the third metal paste.

The solar cell device 10 can be prepared in the above-mentioned processes. The second electrodes 7 may be formed after formation of the third electrode 8, for example. The second electrodes 7 may not be in direct contact with the silicon substrate 1, for example. The first passivation layer 9 need not exist between the second electrodes 7 and the silicon substrate 1. The second electrodes 7 may be in direct contact with the silicon substrate 1. The second electrodes 7 may be located on the protective layer 11, for example.

The first electrode 6, the second electrodes 7, and the third electrode 8 may be formed by applying these metal pastes and then simultaneously firing the respective metal pastes. This can improve the productivity, and improve the output characteristics of the solar cell device 10 as heat history of the silicon substrate 1 is reduced.

Working Example

<Insulation Paste>

Methods for producing insulation pastes according to first to ninth working examples will be described.

First, in a preparing process, six types of fillers (fillers A, B, C, D, E, and F) were prepared. Here, the surface of the fillers made of a silicon oxide was covered with dimethylpolysiloxane to prepare the fillers A. The surface of the fillers made of the silicon oxide was covered with octylsilane to prepare the fillers B. The surface of the fillers made of the silicon oxide was covered with a dodecyl group using dodecyltrimethoxysilane to prepare the fillers C. The surface of the fillers made of the silicon oxide was covered with a dimethylsilyl group using dimethyldichlorosilane to prepare the fillers D. Here, the surface of the fillers made of the silicon oxide was covered with octamethylcyclotetrasiloxane to prepare the fillers E. The six types of fillers had the maximum grain size of approximately 800 nm.

Next in the mixing process, methyltrimethoxysilane as the precursor of the siloxane resin, water, diethyleneglycolmonobutylether as the organic solvent, and hydrochloric acid as the catalyst were mixed together to thereby prepare a mixed solution. Here, 55 parts by mass of methyltrimethoxysilane, 25 parts by mass of water, 20 parts by mass of diethyleneglycolmonobutylether, and 0.000005 parts by mass of hydrochloric acid were mixed together.

Next in the first stirring process, the mixed solution prepared in the mixing process was stirred with a mixing rotor under conditions of the rotational speed of 550 rpm and the stirring time of 45 minutes.

Next in the by-product removing process, water, the catalyst, and methyl alcohol of an organic component as the by-product generated by hydrolysis of methyltrimethoxysilane were volatilized using a drying oven under conditions of the treatment temperature of 85° C. and the treatment time of 180 minutes.

Figure 11:
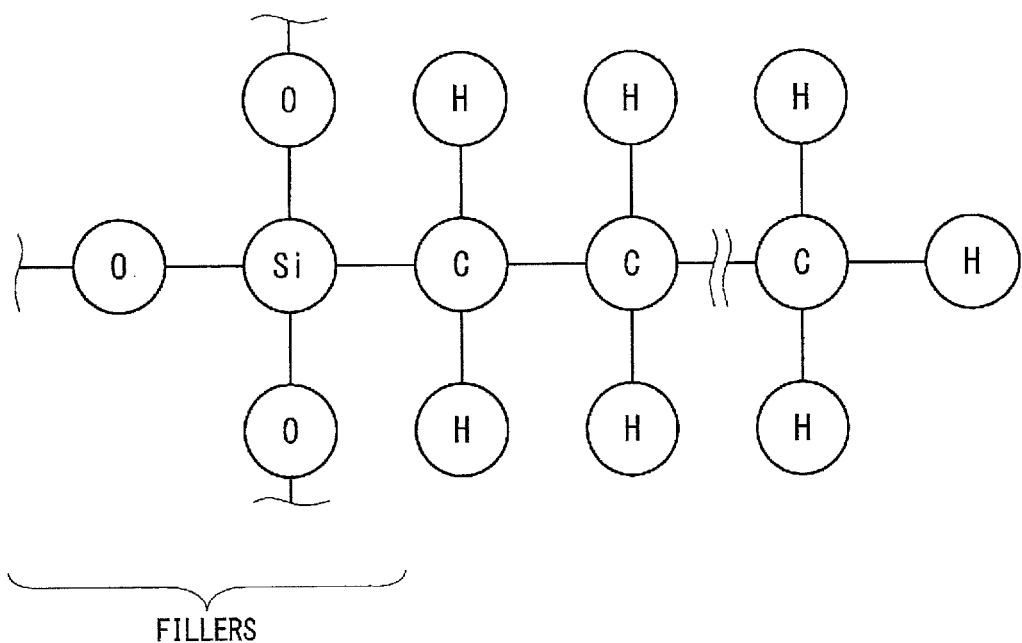
FIG. 11 schematically illustrates a surface portion of fillers each having a surface covered with an organic coating according to one embodiment.
Figure 12:
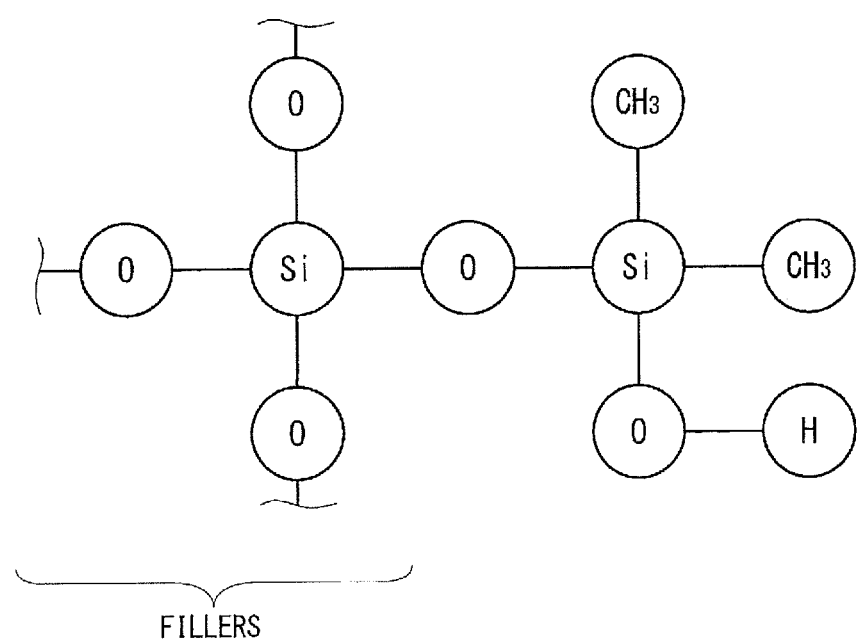
FIG. 12 schematically illustrates a surface portion of fillers each having a surface covered with an organic coating according to one embodiment.

Next in the filler adding process, the fillers A, the fillers B, the fillers C (see FIG. 11), the fillers D (see FIG. 12), and the fillers E each prepared in the preparing process were added to the respective mixed solutions as indicated in Table 1. The number of silicon atoms in the main chain of dimethylpolysiloxane included in the organic coating of the fillers A was approximately 1,500. The number of silicon atoms in the main chain of dimethylpolysiloxane was measured by NMR and IV. Each of the fillers A, the fillers B, and the fillers C covered with the dodecyl group illustrated in FIG. 11 had a structure in which the number of carbon atoms in the main chain or the total number of carbon atoms and silicon atoms in the main chain is six or more, and had the surface covered with the organic coating containing a material different from that of the siloxane resin. As illustrated in FIG. 12, the fillers D had a surface covered with the organic coating containing one silicon atom and one carbon atom in the main chain. The fillers E had a surface covered with the organic coating containing three silicon atoms and two carbon atoms in the main chain. Table 1 illustrates concentrations of the fillers in the prepared insulation pastes. All types of the fillers had the total concentration of 15% by mass in each of the insulation pastes.

Next, the mixed solution was stirred with a rotation and revolution mixer in the second stirring process, for example, under conditions of the rotational speed of 850 rpm and the stirring time of 8 minutes.

Next in the viscosity stabilizing process, the mixed solution was kept in storage at room temperature for a constant time period. The insulation pastes according to the first to ninth working examples in Table 1 were kept in storage at room temperature for six hours.

The insulation pastes including siloxane resin, diethyleneglycolmonobutylether, and the multiple fillers were prepared in the aforementioned processes. In each of the insulation pastes, the concentration of siloxane resin was 60% by mass, the concentration of diethyleneglycolmonobutylether was 25% by mass, and the total concentration of the multiple fillers was 15% by mass.

Next, an insulation paste according to the first reference example in Table 1 was prepared with the same processes as those of the insulation pastes according to the first to ninth working examples. In the insulation paste according to the first reference example, the concentration of the fillers was also 15% by mass. In the insulation paste according to the first reference example, the concentration of the fillers F of a silicon oxide whose surface was not covered with the organic coating was 15% by mass.

<Solar Cell Device>

Next, solar cell devices were prepared using the insulation pastes according to the first to ninth working examples and the first reference example.

First, a polycrystalline silicon substrate that was a square whose one side was approximately 156 mm in plan view and that was approximately 200 μm in thickness was prepared as the silicon substrate 1 including the first semiconductor layer 2 of the p-type. The silicon substrate 1 was etched with a NaOH solution to remove a damaged layer at the surface thereof. The silicon substrate 1 was then cleaned. The texture was formed on the first surface 1a side of the silicon substrate 1 by RIE.

Next, phosphorus was diffused in the silicon substrate 1 by gas phase thermal diffusion using a phosphorus oxychloride ($POCl_3$) as the source of diffusion. The second semiconductor layer 3 of the n-type having a sheet resistance of approximately 90 Ω/□ was thereby formed. Here, the second semiconductor layer formed on the side surfaces 1c side and the second surface 1b side of the silicon substrate 1 was removed using a hydrofluoric-nitric acid solution. Phosphorus glass remaining on the silicon substrate 1 was then removed using a hydrofluoric acid solution.

Next, an aluminum oxide layer was formed as the first passivation layer 9 on the entire surface of the silicon substrate 1 by ALD. The aluminum oxide layer was formed by ALD under the following conditions: The silicon substrate 1 was placed in a chamber of a layer formation apparatus, and a surface temperature of the silicon substrate 1 was maintained at approximately 200° C. The first passivation layer 9 including an aluminum oxide with a thickness of approximately 30 nm was then formed using TMA as an aluminum material and an ozone gas as an oxidizer.

The antireflection layer 5 was then formed to include a silicon nitride film by PECVD on the first passivation layer 9 on the first surface 1a side.

Next, the respective insulation pastes according to the first to ninth working examples were applied, by screen printing, in the patterns with the plurality of openings on the first passivation layers 9 formed on the second surfaces 1b to form the protective layers 11 with thickness of 10 μm according to the first to ninth working examples. Similarly, the insulation paste according to the first reference example was applied to the pattern with the plurality of openings to form the protective layer with thickness of 10 μm according to the first reference example. The applied insulation pastes were dried in a drying oven under conditions of the drying temperature of 300° C. and the drying time of 10 minutes.

Then, the silver paste was applied in a pattern of the first electrode 6 on the first surface 1a side, and applied in a pattern of the second electrodes 7 on the second surface 1b side. Then, the aluminum paste was applied in a pattern of the third electrode 8 on the second surface 1b side. These conductive pastes were fired to form the third semiconductor layer 4, the first electrode 6, the second electrodes 7, and the third electrode 8 to thereby prepare the solar cell devices 10 according to the first to ninth working examples and the solar cell device according to the first reference example.

The viscosity stability, the printing properties, and the barrier function indicating denseness were evaluated for the insulation pastes according to the first to ninth working examples and the insulation paste according to the first reference example as follows.

The insulation pastes were kept in storage at room temperature in an atmosphere. The viscosity stability of the insulation paste that was not gelatinized for ten days was evaluated as "⊙ (Excellent)". The viscosity stability of the insulation paste that was gelatinized for 7 days or more to less than 10 days was evaluated as "O (Good)". The viscosity stability of the insulation paste that was gelatinized before a lapse of 7 days was evaluated as "X (NG)". Change in the viscosity of the insulation paste evaluated as "⊙ (Excellent)" was less than 10% even after storage at room temperature in an atmosphere for 1 week. Change in the viscosity of the insulation paste evaluated as "O (Good)" was more than or equal to 10% and less than 25% even after storage at room temperature in an atmosphere for 1 week. Change in the viscosity of the insulation paste evaluated as "X (NG)" was more than or equal to 25% after storage at room temperature in an atmosphere for 1 week. Since the insulation paste according to the first reference example was gelatinized after storage at room temperature in an atmosphere for 1 week (actually, approximately for 3 days to 5 days), the viscosity could not be measured and thus change in the viscosity was evaluated as being more than or equal to 25%. Here, the viscosity of the insulation paste was measured using a viscosity-viscoelasticity measuring instrument.

As the viscosity stability of the insulation paste is more favorable, the viscosity of the insulation paste is hardly changed in continuously applying the insulation paste. Thus, the mesh for screen platemaking is hardly clogged. Thus, it will not be difficult to form the insulation paste in a desired pattern, for example, with its application 100 times relative to its first application. Since the protective layer 11 is reliably formed in a region of the first passivation layer 9 to be covered with the protective layer 11, a problem that part of aluminum fires through the passivation layer in the firing for forming the third electrode 8 hardly occurs. As a result of this, the photoelectric conversion characteristics of the solar cell device 10 hardly decrease.

To evaluate the printability, the insulation pastes were applied using the plate for screen platemaking having a pattern for making the protective layer 11 have rectangular openings each having an opening width of 70 μm in plan view of the protective layer 11. With the openings on the protective layer 11 having the average opening width of 50 μm or more, the printability was evaluated as "⊙ (Excellent)". With the openings having the average opening width of 40 μm or more to less than 50 μm, the printability was evaluated as "O (Good)". With the openings having the average opening width of less than 40 μm, the printability was evaluated as "X (NG)". Here, the bleeding ranging approximately from 5 μm to 10 μm in size narrowed the opening widths of the insulation pastes evaluated as "O (Good)". The bleeding made the openings of the insulation pastes evaluated as "X (NG)" flat during drying of the insulation pastes after its application. Thus, the openings hardly remained.

To evaluate the barrier function, the protective layers 11 formed by applying and drying the insulation pastes were observed through an optical microscope. Here, without any confirmation of a crack with a width of 1 μm or more, the barrier function was evaluated as "⊙ (Excellent)". With confirmation of the crack with the width of 1 μm or more, the barrier function was evaluated as "X (NG)". In a region where the protective layer 11 without any crack with the width of 1 μm or more confirmed was formed, the third electrode 8 was removed by etching using a hydrochloric acid, and the effective lifetime of the minority carriers was measured. With decrease in the effective lifetime similarly as at the site of contact with the third electrode 8, the barrier function was also evaluated as "X (NG)".

TABLE 1

| | Fillers | | | | | | Viscosity | Printability | Barrier |
| | A | B | C | D | E | F | Stability | | Function |
| | % by mass | | | | | | | | |
| --- | --- | --- | --- | --- | --- | --- | --- | --- | --- |
| First Working Example | 15 | 0 | 0 | 0 | 0 | 0 | ⊙ (Excellent) | ⊙ (Excellent) | ⊙ (Excellent) |
| Second Working Example | 0 | 15 | 0 | 0 | 0 | 0 | ⊙ (Excellent) | ⊙ (Excellent) | ⊙ (Excellent) |
| Third Working Example | 0 | 0 | 15 | 0 | 0 | 0 | ⊙ (Excellent) | ⊙ (Excellent) | ⊙ (Excellent) |
| Fourth Working Example | 7.5 | 7.5 | 0 | 0 | 0 | 0 | ⊙ (Excellent) | ⊙ (Excellent) | ⊙ (Excellent) |
| Fifth Working Example | 7.5 | 0 | 7.5 | 0 | 0 | 0 | ⊙ (Excellent) | ⊙ (Excellent) | ⊙ (Excellent) |
| Sixth Working Example | 0 | 7.5 | 7.5 | 0 | 0 | 0 | ⊙ (Excellent) | ⊙ (Excellent) | ⊙ (Excellent) |
| Seventh | 5 | 5 | 5 | 0 | 0 | 0 | ⊙ | ⊙ | ⊙ (Excellent) |

TABLE 1-continued

|  | Fillers | | | | | | Viscosity | | Barrier |
|  | A | B | C | D | E | F | Stability | Printability | Function |
|  | | | % by mass | | | | | | |
|---|---|---|---|---|---|---|---|---|---|
| Working Example | | | | | | | (Excellent) | (Excellent) | |
| Eighth Working Example | 0 | 0 | 0 | 15 | 0 | 0 | O (Good) | O (Good) | ⊙ (Excellent) |
| Ninth Working Example | 0 | 0 | 0 | 0 | 15 | 0 | O (Good) | O (Good) | ⊙ (Excellent) |
| First Reference Example | 0 | 0 | 0 | 0 | 0 | 15 | X (NG) | X (NG) | X (NG) |

Table 1 shows that the insulation pastes according to the first to ninth working examples had less occurrence of the crack in the protective layer 11 in the drying process and had more favorable barrier function than those of the insulation paste according to the first reference example. Table 1 also shows that both the printability and the viscosity stability of the insulation pastes according to the eighth and ninth working examples were more favorable than those of the insulation paste according to the first reference example. The insulation pastes according to the first to seventh working examples had little change in the viscosity after storage at room temperature for 1 week, and were far superior in the printability and the viscosity stability to those according to the eighth and ninth working examples.

Since the insulation paste according to the eighth working example included the fillers each having the surface covered with the organic coating, the viscosity stability and the printability of the insulation paste were favorable to some extent. Since the insulation paste according to the ninth working example also included the fillers each having the surface covered with the organic coating, the viscosity stability and the printability of the insulation paste were also favorable to some extent. The insulation paste according to the eighth working example included the fillers (see FIG. 12) each having the surface covered with the organic coating of the dimethylsilyl group whose number of carbon atoms in the main chain and whose total number of carbon atoms and silicon atoms in the main chain is smaller than six. The insulation paste according to the ninth working example included the fillers each having the surface covered with the organic coating of octamethylcyclotetrasiloxane whose number of carbon atoms in the main chain and whose total number of carbon atoms and silicon atoms in the main chain is smaller than six. Since the insulation pastes according to the first to seventh working examples included, as a material of an organic coating, dimethylpolysiloxane or a material having a structure in which the number of carbon atoms in the main chain or the total number of carbon atoms and silicon atoms in the main chain is more than or equal to six, the viscosity stability and the printability were far superior.

The insulation paste according to the first reference example caused cracks in the protective layer 11 some of which were large in width. Thus, it was presumed that in the firing for forming the third electrode 8, part of aluminum fires, via the cracks, through the first passivation layer 9 to be covered with the protective layer 11. It was presumed that the protective layer 11 is easily peeled from the first passivation layer 9 in the firing for forming the third electrode 8.

As the viscosity stability of the insulation paste is more favorable, the viscosity of the insulation paste is hardly changed in continuously applying the insulation paste. Thus, the mesh for screen platemaking is hardly clogged. With respect to the insulation paste according to the first reference example, it will be difficult to form the insulation paste in a desired pattern, for example, with its application 100 times relative to its first application. Here, the protective layer 11 is not formed in a region where the protective layer 11 should be formed, and part of aluminum fires through the passivation layer in forming the third electrode 8. As a result of this, it is expected that the photoelectric conversion characteristics of the solar cell device 10 will decrease.

Consequently, we could confirm the insulation pastes according to the first to ninth working examples as the insulation pastes which allow for appropriate adjustment in viscosity and are easily applicable for favorable patterning.

<Presence of Dimethylpolysiloxane in the Protective Layer>

The solar cell device 10 was prepared using the insulation paste according to the first working example in the same method as that for preparing the solar cell devices 10 using the insulation pastes according to the first to ninth working examples and the first reference example. After an insulation paste was applied to the first passivation layer 9, the insulation paste was dried under conditions of the maximum temperature of 230° C. and the heating time of 250 seconds. The metal paste was fired at the maximum temperature of 730° C. to form the third semiconductor layer 4, the first electrode 6, the second electrodes 7, and the third electrode 8 to thereby prepare the solar cell device 10.

Figure 13:
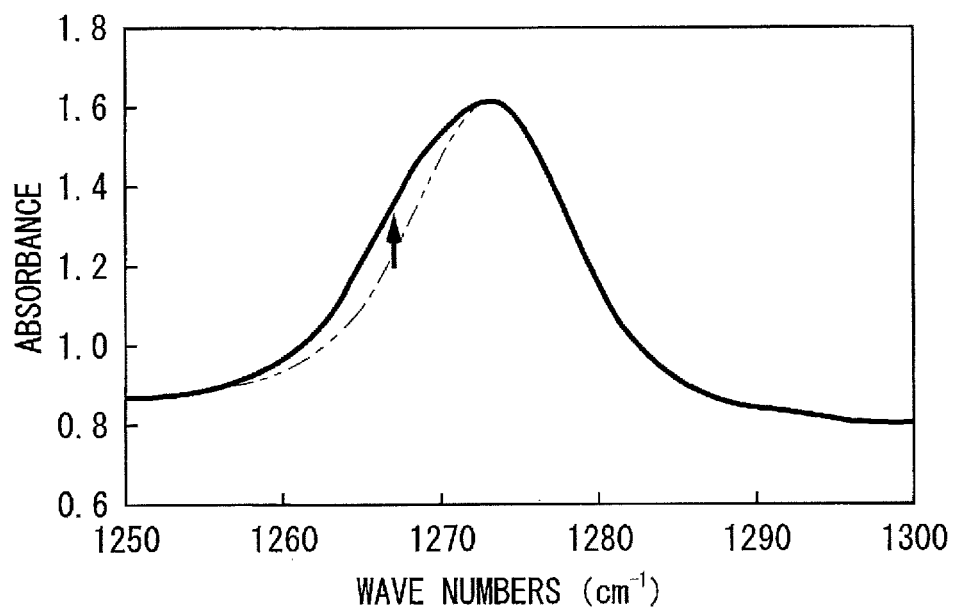
FIG. 13 illustrates an example result of FT-IR analysis on a protective layer according to one embodiment.

The third electrode 8 of the solar cell device 10 prepared in such a manner was then removed by etching using hydrochloric acid to expose the protective layer 11. The protective layer 11 was measured by FT-IR. Dimethylpolysiloxane was identifiable by referring to spectra (the curve depicted by the thick line in FIG. 13) having wave numbers around 1250 cm$^{-1}$ to 1300 cm$^{-1}$ from among spectra having wave numbers obtained by the measurement by FT-IR. The narrow alternate long and two short dashes line is positioned to the left of the graph in FIG. 13 to be horizontally symmetrical with the measurement values to the right of the graph for the purpose of reference.

Figure 14:
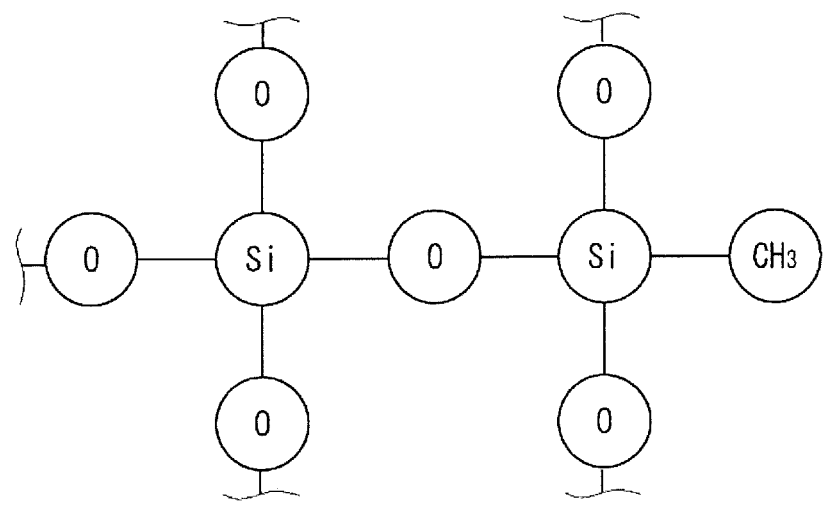
FIG. 14 illustrates the molecular structure of a siloxane resin.
Figure 15:
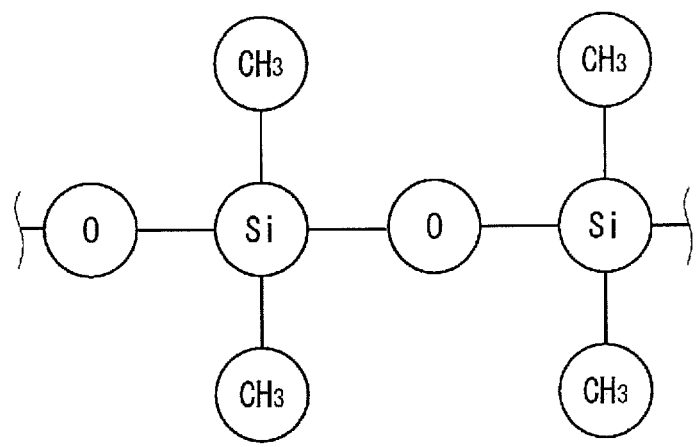
FIG. 15 illustrates the molecular structure of dimethylpolysiloxane.
Figure 16:
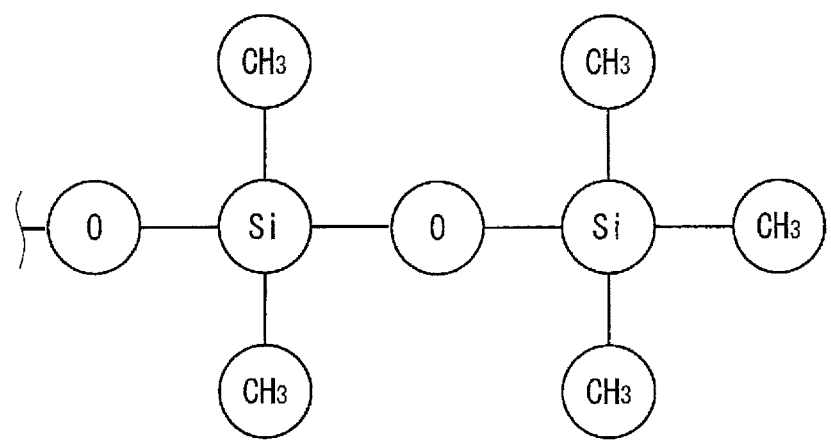
FIG. 16 illustrates the molecular structure at the terminal portion of dimethylpolysiloxane.

Specifically, the peak measurement value corresponding to the Si-CH$_3$ bond in the terminal portion (see FIG. 14) of the siloxane resin as a main component of the protective layer 11 was observed in the wave numbers around 1270 cm$^{-1}$. Increase in the measurement value was further observed in the wave numbers around 1250 cm$^{-1}$ to 1260 cm$^{-1}$. The measurement value increased in the wave numbers around 1260 cm$^{-1}$ corresponds to the binding of two methyl groups (CH$_3$) per Si in dimethylpolysiloxane (see FIG. 15). The binding of three methyl groups (CH$_3$) per Si in dimethylpolysiloxane was measured by NMR. Thus, we confirmed that the protective layer 11 mainly included the siloxane resin, and also dimethylpolysiloxane.

<Reliability of Solar Cell Module>

The influence of the component of the organic coating on the reliability of a solar cell module was tested. The organic coating covers the surfaces of the fillers included in the insulation paste for forming the protective layer 11. The fillers A covered with dimethylpolysiloxane as described above and the fillers F not covered with the organic coating as described above were used as the fillers to be added to the insulation pastes to prepare solar cell modules.

Here, solar cell devices were prepared using (i) an insulation paste including the fillers A similar to the insulation paste according to the first working example (also referred to as an insulation paste according to the tenth working example), and (ii) an insulation paste including the fillers F not covered with the organic coating similar to the insulation paste according to the first reference example (also referred to as an insulation paste according to the second reference example).

First, a polycrystalline silicon substrate that was a square whose one side was approximately 156 mm in plan view and that was approximately 200 µm in thickness was prepared as the silicon substrate 1 including the first semiconductor layer 2 of the p-type. The silicon substrate 1 was etched with a hydrofluoric-nitric acid solution to remove a damaged layer and a contaminated layer at the surface thereof. Then, the silicon substrate 1 was then cleaned. The texture was formed on the first surface 1a side of the silicon substrate 1 by RIE.

Next, phosphorus was diffused in the silicon substrate 1 by gas phase thermal diffusion using a phosphorus oxychloride (POCl$_3$) as the source of diffusion. The second semiconductor layer 3 of the n-type having a sheet resistance of approximately 90 Ω/□ was thereby formed. Here, the second semiconductor layer formed on the side surfaces 1c side and the second surface 1b side of the silicon substrate 1 was removed using a hydrofluoric-nitric acid solution. Phosphorus glass remaining on the silicon substrate 1 was then removed using a hydrofluoric acid solution.

An aluminum oxide layer was then formed as the first passivation layer 9 on the entire surface of the silicon substrate 1 by ALD. The aluminum oxide layer was formed by ALD under the following conditions: The silicon substrate 1 was placed in a chamber of a layer formation apparatus, and a surface temperature of the silicon substrate 1 was maintained at approximately 150° C. The first passivation layer 9 including an aluminum oxide with a thickness of approximately 30 nm was then formed using TMA as an aluminum material and an ozone gas as an oxidizer.

The antireflection layer 5 was then formed to include a silicon nitride film on the first passivation layer 9 on the first surface 1a side by PECVD. Here, the antireflection layer 5 with a thickness of approximately 65 nm was formed by supplying a mixed gas including silane (SiH$_4$), ammonia (NH$_3$), and nitrogen (N$_2$).

Then, the insulation paste according to the tenth working example was applied with a thickness of 2 µm to the first passivation layer 9 framed on the second surface 1b by screen printing. Similarly, the insulation paste according to the second reference example was applied with a thickness of 2 µm to the first passivation layer 9 formed on the second surface 1b. Then, a drying process was performed on the applied insulation pastes in a drying oven under conditions of the drying temperature of 200° C. and the drying time of 5 minutes.

Next, the dried insulation pastes were irradiated with laser light to form contact holes each with a diameter of approximately 120 µm. Consequently, the protective layer 11 according to the tenth working example and the protective layer according to the second reference example were formed.

Then, the silver paste was applied in a pattern of the first electrode 6 on the first surface 1a side, and applied in a pattern of the second electrodes 7 on the second surface 1b side. The applied silver paste included a metal powder containing silver as a main component, an organic vehicle, and a glass frit. Then, the aluminum paste was applied in a pattern of the third electrode 8 on the second surface 1b side. Here, part of the aluminum paste was applied to overlap the silver paste applied on the second surface 1b side. The applied aluminum paste included a metal powder containing aluminum as a main component, an organic vehicle, and a glass frit. The silver paste and the aluminum paste were applied by screen printing.

These conductive pastes were fired under conditions of the maximum temperature of 720° C. and the heating time of approximately 1 minute to each form the third semiconductor layer 4, the first electrode 6, the second electrodes 7, and the third electrode 8. Consequently, the solar cell device 10 according to the tenth working example and the solar cell device according to the second reference example were prepared.

In addition, solar cell modules were prepared in the following manner. Here, a solar cell module including sixty solar cell devices 10 according to the tenth working example, and a solar cell module including sixty solar cell devices according to the second reference example were prepared in the similar manner. A method for preparing the solar cell module according to the tenth working example will be described as an example.

A plurality of strip wires were prepared. The strip wires were coated with solder having a thickness of approximately 20 µm to a copper foil surface having a thickness of approximately 200 µm. A plurality of the solar cell devices 10 were electrically connected in series using these strip wires. Specifically, ten solar cell devices 10 were aligned, and each of the strip wires was disposed from the output extracting electrode 6a on the light-receiving surface side of the first solar cell device 10 toward the second electrodes 7 on the rear-surface side of the second solar cell device 10. The first solar cell device 10 and the second solar cell device 10 were included in the adjacent solar cell devices 10. The wires were jointed to the output extracting electrodes 6a and the second electrodes 7 by soldering with application of hot air ranging from 400° C. to 500° C. to the strip wires with the strip wires pressed to the output extracting electrodes 6a and the second electrodes 7. Consequently, a solar cell string including the ten solar cell devices 10 connected in series was prepared. Furthermore, six solar cell strings were arranged planar parallel and the strip wires were further jointed to each other by soldering to prepare a portion in which sixty solar cell devices 10 were electrically connected in series (also referred to as a solar cell portion).

Next, a glass substrate, a surface side sealing material, the solar cell portion, a rear-surface side sealing material, and a resin back sheet were laminated in this order to prepare a laminated body. This laminated body was disposed on a laminator and heated at a temperature of approximately 150° C. for approximately 30 minutes under a reduced pressure to prepare a solar cell module in which portions of the laminated body were integrated.

Next, a terminal box was attached to the back sheet of the solar cell module with a silicone resin adhesive. Then, the strip wires drawn from the solar cell devices 10 at both ends of the solar cell portion were fastened to terminals of the terminal box by soldering. Then, the lid was put on the terminal box.

Next, an aluminum frame was placed around the solar cell module. Here, corners of the frame were fastened with screws. Consequently, the solar cell module according to the tenth working example was prepared. Similarly, the solar cell module according to the second reference example was prepared.

Here, the solar cell module according to the tenth working example and the solar cell module according to the second reference example that were prepared as described above were measured for the maximum output (Pmax), the short-circuit current (Isc), the open-circuit voltage (Voc), and the fill factor (FF). Here, the maximum output, the short-circuit current, the open-circuit voltage, and the fill factor were measured in conformity with Japanese Industrial Standards (JIS) C8913. Specifically, the measurements were made using a fixed light solar simulator under conditions of the light intensity on the light-receiving surface of 100 mW/cm$^2$ and the air mass (AM) of 1.5.

Figure 19:
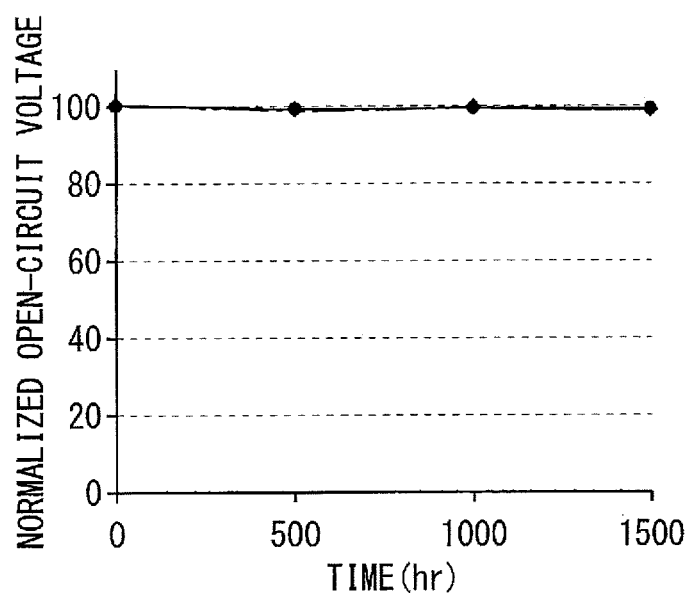
FIG. 19 illustrates a graph showing an example test result on the reliability of the solar cell modules according to working examples and reference examples.
Figure 20:
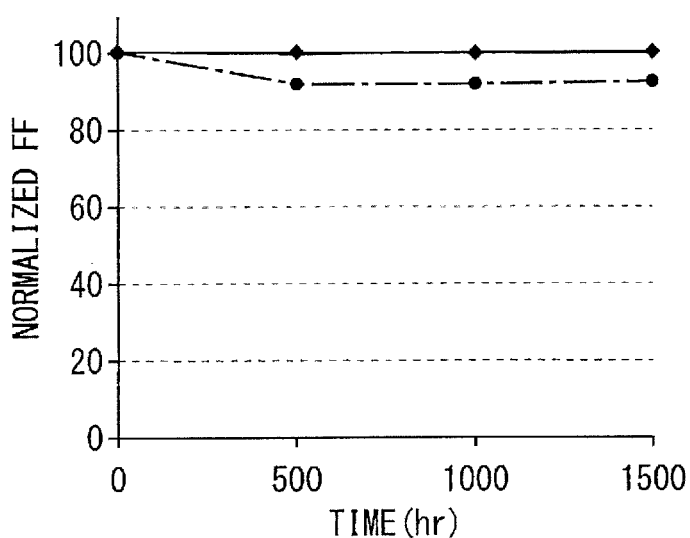
FIG. 20 illustrates a graph showing an example test result on the reliability of the solar cell modules according to working examples and reference examples.

Furthermore, the maximum output, the short-circuit current, the open-circuit voltage, and the fill factor were measured after performing the Temperature and Humidity Controlled Test as an accelerated test on the solar cell module according to the tenth working example and the solar cell module according to the second reference example. Here, the Temperature and Humidity Controlled Test was conducted by placing each of the solar cell modules in environmental test equipment for 500 hours, 1,000 hours, and 1,500 hours under an environment with the temperature of 95° C. and the humidity of 95%. FIGS. 17 to 20 illustrate chronological change in the normalized measurement values of the solar cell module subjected to the Temperature and Humidity Controlled Test according to the tenth working example with respect to the initial values before the Temperature and Humidity Controlled Test as 100, using polygonal lines depicted by thick lines. FIGS. 17 to 20 also illustrate chronological change in the normalized measurement values of the solar cell module subjected to the Temperature and Humidity Controlled Test according to the second reference example with respect to the initial values before the Temperature and Humidity Controlled Test as 100, using polygonal lines depicted by alternate long and short dash lines. FIG. 17 illustrates the normalized maximum output (Pmax). FIG. 18 illustrates the normalized short-circuit current (Isc). FIG. 19 illustrates the normalized open-circuit voltage (Voc). FIG. 20 illustrates the normalized fill factor (FF).

As illustrated in FIGS. 17 to 20, the characteristics of the solar cell module subjected to the Temperature and Humidity Controlled Test according to the tenth working example decreased less than those of the solar cell module subjected to the Temperature and Humidity Controlled Test according to the second reference example. Thus, we found that the solar cell module according to the tenth working example deteriorates less than the solar cell module according to the second reference example. It was presumed that the component of the organic coating of the fillers included in the insulation paste contributes to less deterioration in the solar cell module according to the tenth working example. Particularly, it was presumed that hydrophobicity of the protective layer 11 and the function of protecting, by the protective layer 11, the first passivation layer 9 have been improved since dimethylpolysiloxane that is the component of the organic coating of the fillers A is included in the protective layer 11 of the solar cell module according to the tenth working example. Thus, it was presumed that inclusion of the fillers having the surfaces covered with the organic coating in the insulation paste for forming the protective layer 11 can improve the quality of the first passivation layer 9 in the solar cell device 10. It was also presumed that, for example, dimethylpolysiloxane in the protective layer 11 of the solar cell device 10 can improve the quality of the first passivation layer 9 in the solar cell device 10. The dimethylpolysiloxane corresponds to the component included in the organic coating of the insulation paste.

The invention claimed is:

1. A solar cell device, comprising:
   a semiconductor substrate having a p-type semiconductor region on a surface of the semiconductor substrate;
   a passivation layer located on the p-type semiconductor region, the passivation layer including an aluminum oxide; and
   a protective layer located on the passivation layer, the protective layer containing a silicon oxide,
   wherein the protective layer contains a siloxane resin and dimethylpolysiloxane, and wherein the siloxane resin consists of a material different than dimethylpolysiloxane and includes a siloxane bond in a main chain and a Si—O bond in a side chain.

2. The solar cell device according to claim 1,
   wherein the dimethylpolysiloxane is terminated by a methyl group.

3. The solar cell device according to claim 2,
   wherein the protective layer includes a Si—OH bond.

4. The solar cell device according to claim 2, further comprising
   a silicon oxide layer between the protective layer and the passivation layer, the silicon oxide layer being denser than the protective layer.

5. The solar cell device according to claim 1,
   wherein the protective layer comprises 7% to 90% by mass of the siloxane resin.

* * * * *